(12) United States Patent
Kitagishi et al.

(10) Patent No.: US 12,451,387 B2
(45) Date of Patent: Oct. 21, 2025

(54) SUBSTRATE PROCESSING APPARATUS, TEACHING INFORMATION GENERATION METHOD, TEACHING SET, AND SUBSTRATE JIG

(71) Applicant: SCREEN Holdings Co., Ltd., Kyoto (JP)

(72) Inventors: Daiichi Kitagishi, Kyoto (JP); Hiroshi Horiguchi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 733 days.

(21) Appl. No.: 17/699,802

(22) Filed: Mar. 21, 2022

(65) Prior Publication Data
US 2022/0310436 A1    Sep. 29, 2022

(30) Foreign Application Priority Data
Mar. 24, 2021    (JP) .................................. 2021-049840

(51) Int. Cl.
*H01L 21/683* (2006.01)
*H01L 21/67* (2006.01)
(Continued)

(52) U.S. Cl.
CPC .... *H01L 21/6835* (2013.01); *H01L 21/67259* (2013.01); *H01L 21/67766* (2013.01);
(Continued)

(58) Field of Classification Search
CPC ........... H01L 21/6835; H01L 21/67259; H01L 21/67766; H01L 21/67769; H01L 21/681; H01L 21/68707; H01L 21/68764
See application file for complete search history.

(56) References Cited

U.S. PATENT DOCUMENTS 6,934,606 B1 * 8/2005 Genetti ................. H01L 21/681
                                              118/712
8,634,633 B2 * 1/2014 Kiley ..................... G05B 19/02
                                              382/141
(Continued)

FOREIGN PATENT DOCUMENTS

JP    2001-068530 A    3/2001
JP    2001-156153 A    6/2001
(Continued)

OTHER PUBLICATIONS

Korean Office Action dated Mar. 13, 2024, issued in corresponding Korean Patent Application No. 10-2022-0033949 and its English translation.
(Continued)

*Primary Examiner* — Kyle O Logan
(74) *Attorney, Agent, or Firm* — OSTROLENK FABER LLP

(57) ABSTRACT

In a substrate processing apparatus, when a hand located above a substrate holder holds a substrate jig having a lower surface provided with three photosensors that are arranged nonlinearly, a substrate rotation mechanism rotates the substrate holder to form a circular rotation trajectory of a mark provided in advance on the substrate holder. A teaching unit calculates the position of the hand relative to the substrate holder in plan view in accordance with the position of the hand relative to the rotation trajectory obtained from each of the three photosensors and generates horizontal teaching information that indicates an adequate relationship between the relative positions of the hand and the substrate holder in plan view. This simplifies processing for generating teaching information.

14 Claims, 10 Drawing Sheets

(51) Int. Cl.
  *H01L 21/677* (2006.01)
  *H01L 21/68* (2006.01)
  *H01L 21/687* (2006.01)

(52) U.S. Cl.
  CPC ...... *H01L 21/67769* (2013.01); *H01L 21/681* (2013.01); *H01L 21/68707* (2013.01); *H01L 21/68764* (2013.01)

(56) References Cited

U.S. PATENT DOCUMENTS

| | | | |
|---|---|---|---|
| 9,405,287 B1 | 8/2016 | Ravid et al. | |
| 9,785,247 B1 | 10/2017 | Horowitz | H04N 13/296 |
| 9,908,237 B2* | 3/2018 | Nammoto | B25J 9/1633 |
| 2001/0002447 A1 | 5/2001 | Kawamatsu et al. | |
| 2003/0044261 A1* | 3/2003 | Bonora | H01L 21/67775 414/217 |
| 2005/0016818 A1 | 1/2005 | Ito et al. | 198/345.1 |
| 2005/0034288 A1* | 2/2005 | Adachi | H01L 21/67259 29/25.01 |
| 2005/0201424 A1* | 9/2005 | Yoshida | G01S 17/42 372/9 |
| 2006/0192514 A1* | 8/2006 | Adachi | H01L 21/681 318/568.13 |
| 2007/0100488 A1* | 5/2007 | Nagayasu | H01L 21/68 700/114 |
| 2007/0290150 A1* | 12/2007 | Krupyshev | G01V 8/12 250/559.33 |
| 2008/0102200 A1 | 5/2008 | Doki et al. | 427/240 |
| 2008/0135788 A1* | 6/2008 | Fogel | H01L 21/681 250/559.07 |
| 2008/0252248 A1* | 10/2008 | Lundberg | B25J 9/1697 318/572 |
| 2009/0028683 A1* | 1/2009 | Zywno | H01J 37/3174 414/754 |
| 2009/0051370 A1 | 2/2009 | Doki et al. | 324/658 |
| 2009/0198377 A1* | 8/2009 | Adachi | H01L 21/67742 700/250 |
| 2010/0271229 A1* | 10/2010 | Allen-Blanchette | H01L 21/681 340/815.4 |
| 2010/0280790 A1* | 11/2010 | Rodnick | H01L 21/681 356/621 |
| 2013/0085595 A1* | 4/2013 | Kiley | H01L 21/67259 700/121 |
| 2014/0207284 A1 | 7/2014 | Kiley et al. | 700/258 |
| 2017/0018446 A1* | 1/2017 | Yin | H01L 21/68707 |
| 2017/0050211 A1* | 2/2017 | Inagaki | H01L 21/681 |
| 2017/0372933 A1 | 12/2017 | Kim | |
| 2018/0053319 A1 | 2/2018 | Kakuma et al. | |
| 2019/0172742 A1 | 6/2019 | Mochizuki | |
| 2019/0371635 A1 | 12/2019 | Oori | |
| 2021/0074567 A1* | 3/2021 | Safrani | H01L 21/67259 |
| 2021/0134652 A1 | 5/2021 | Muramoto | |
| 2022/0111534 A1* | 4/2022 | Yoshida | B25J 9/1612 |
| 2022/0193917 A1* | 6/2022 | Tan | B25J 9/1664 |
| 2022/0395986 A1* | 12/2022 | Blank | B25J 9/042 |
| 2023/0175985 A1* | 6/2023 | Murata | G01N 23/044 378/19 |

FOREIGN PATENT DOCUMENTS

| | | |
|---|---|---|
| JP | 2002-124556 A | 4/2002 |
| JP | 2005-011966 A | 1/2005 |
| JP | 2006-140350 A | 6/2006 |
| JP | 2006-332543 | 12/2006 |
| JP | 2009-054665 A | 3/2009 |
| JP | 2009-184069 A | 8/2009 |
| JP | 2019-212655 A | 12/2009 |
| JP | 2017-045922 A | 3/2017 |
| JP | 2018-523288 A | 8/2018 |
| JP | 2019-057680 A | 4/2019 |
| JP | 2020-096079 A | 6/2020 |
| KR | 10-1015778 B1 | 2/2011 |
| KR | 10-2018-0001620 A | 1/2018 |
| KR | 10-2019-0067105 A | 6/2019 |

OTHER PUBLICATIONS

Office Action issued on Dec. 26, 2024 for the corresponding Japanese Patent Application No. 2021-049840 with its English translation.
Office Action issued on Jan. 10, 2023 for corresponding Taiwanese Patent Application No. 111110797.
Office Action dated Jul. 30, 2025 for corresponding Chinese Patent Application No. 202210303673.9. Machine translation attached.

* cited by examiner

SUBSTRATE PROCESSING APPARATUS, TEACHING INFORMATION GENERATION METHOD, TEACHING SET, AND SUBSTRATE JIG

CROSS-REFERENCE TO RELATED APPLICATION

This application claims priority benefit of Japanese Patent Application No. 2021-049840 filed in the Japan Patent Office on Mar. 24, 2021, the entire disclosure of which is incorporated herein by reference.

TECHNICAL FIELD

The present invention relates to a technique for use in a substrate processing apparatus and for generating teaching information that indicates a substrate transport position of a transport robot.

BACKGROUND ART

In conventional substrate processing apparatuses for processing substrates, substrates stored in FOUPs or other carriers are transported out and transferred to a center robot by an indexer robot and then transported into processing units in which a variety of processing is performed on the substrates. In such substrate processing apparatuses, a transport robot such as the center robot has a preset substrate transport path, but it is still necessary to teach a detailed transport position to the transport robot while actually moving the transport robot during, for example, transport of substrates into and out of processing units. Such teaching processing may be performed, for example, at the startup of the substrate processing apparatuses or before resuming the use of the substrate processing apparatus after disassembly and maintenance.

For example, teaching processing disclosed in Japanese Patent Application Laid-Opens No. 2001-156153 (Document 1) and No. 2006-332543 (Document 2) involves causing a substrate holder in each processing unit to hold a target jig for teaching and then detecting a projection that projects upward from the center of the target jig (i.e., a to-be-detected portion) with an optical sensor held by a transport robot so as to detect the relative positions of the substrate holder and the transport robot. Then, the position of the transport robot relative to the substrate holder is adjusted by repeatedly moving the transport robot so as to make these relative positions at set values.

Meanwhile, in the teaching processing disclosed in Documents 1 and 2, it is necessary, before driving the transport robot, to adjust the position of the target jig relative to the substrate holder with high accuracy and to cause the substrate holder to hold the target jig. Thus, considerable amounts of time and effort are necessary for the positioning of the target jig. Besides, since each processing unit in the substrate processing apparatus needs to perform positioning of the target jig, much considerable amounts of time and effort are necessary for the teaching processing described above.

SUMMARY OF INVENTION

The present invention is intended for a substrate processing apparatus, and it is an object of the present invention to simplify processing for generating teaching information.

A substrate processing apparatus according to one preferable embodiment of the present invention includes a processing unit that performs predetermined processing on a substrate, a transport robot that transports the substrate to the processing unit, and a teaching unit that teaches a substrate transport position of the transport robot in the processing unit to the transport robot. The processing unit includes a substrate holder that holds the substrate in a horizontal positon, and a substrate rotation mechanism that rotates the substrate holder about a rotation axis pointing in an up-down direction. The transport robot includes a hand that transfers the substrate to and from the substrate holder. When the hand located above the substrate holder holds a substrate jig having a lower surface provided with three optical sensors that are arranged nonlinearly, the substrate rotation mechanism rotates the substrate holder to form a circular rotation trajectory of a mark provided in advance on the substrate holder. The teaching unit calculates a position of the hand relative to the substrate holder in plan view in accordance with the position of the hand relative to the rotation trajectory obtained from each of the three optical sensors and generates horizontal teaching information that indicates an adequate relationship between relative positions of the hand and the substrate holder in plan view.

According to the present invention, it is possible to simplify the processing for generating teaching information.

Preferably, the substrate holder is a mechanical chuck that mechanically holds an outer peripheral portion of the substrate by a plurality of chuck pins that are arranged circularly. The mark corresponds to one or more of the plurality of chuck pins.

Preferably, the substrate holder is a vacuum chuck having an upper surface provided with a plurality of suction ports to absorb and hold the substrate. The mark corresponds to one or more of the plurality of suction ports.

Preferably, the hand is moved to make the rotation axis and a center of the substrate jig overlap each other in plan view in accordance with relative positions of the hand and the substrate holder in plan view calculated by the teaching unit. The substrate rotation mechanism rotates the substrate holder to again form the rotation trajectory of the mark. After the formation of the rotation trajectory, the teaching unit again calculates a position of the hand relative to the substrate holder in plan view in accordance with the position of the hand relative to the rotation trajectory obtained from each of the three optical sensors and generates the horizontal teaching information.

Preferably, the transport robot further includes a different hand that is located below the hand and that transfers the substrate to and from the substrate holder. The teaching unit generates different horizontal teaching information about the different hand in the same manner as the horizontal teaching information about the hand.

Preferably, the lower surface of the substrate jig is provided with a contact sensor that detects contact with the substrate holder. The transport robot moves the hand closer to the substrate holder in the up-down direction. The teaching unit generates vertical teaching information that indicates an adequate relationship between relative positions of the hand and the substrate holder in the up-down direction in accordance with an output from the contact sensor.

Preferably, the substrate holder is a mechanical chuck that mechanically holds an outer peripheral portion of the substrate by a plurality of chuck pins that are arranged circularly. The contact sensor includes a plurality of sensor elements that are arranged circularly on an outer peripheral portion of the lower surface of the substrate jig.

Preferably, the processing unit further includes a housing that houses the substrate holder and that has an opening through which the substrate is transported in. When the hand is inserted in the opening of the housing, an image that indicates relative positions of the hand and the opening is captured. The teaching unit generates, in accordance with the captured image, carry-in teaching information that indicates an adequate relationship between the relative positions of the hand and the opening.

Preferably, the image is an image of the opening captured by a camera provided on the hand or the substrate jig.

A substrate processing apparatus according to another preferable embodiment of the present invention includes a processing unit that performs predetermined processing on a substrate, a transport robot that transports the substrate to the processing unit, and a teaching unit that teaches a substrate transport position of the transport robot in the processing unit to the transport robot. The processing unit includes a substrate holder that holds the substrate in a horizontal position, and a substrate rotation mechanism that rotates the substrate holder about a rotation axis pointing in an up-down direction. The transport robot includes a hand that transfers the substrate to and from the substrate holder. The processing unit also rotates a rotary part other than the substrate holder about the rotation axis. When the hand located above the substrate holder holds a substrate jig provided with three optical sensors that are arranged nonlinearly, the rotary part is rotated to form a circular rotation trajectory of a mark provided in advance on the rotary part. The teaching unit calculates a positon of the hand relative to the rotation axis in plan view in accordance with the position of the hand relative to the rotation trajectory obtained from each of the three optical sensors and generates horizontal teaching information that indicates an adequate relationship between relative positions of the hand and the substrate holder in plan view.

The present invention is also directed for a teaching information generation method of generating teaching information and for use in a substrate processing apparatus that includes a processing unit that performs predetermined processing on a substrate and a transport robot that transports the substrate to the processing unit, the teaching information teaching a substrate transport position of the transport robot in the processing unit. The processing unit includes a substrate holder that holds the substrate in a horizontal position, and a substrate rotation mechanism that rotates the substrate holder about a rotation axis pointing in an up-down direction. The transport robot including a hand that transfers the substrate to and from the substrate holder. A teaching information generation method according to one preferable embodiment of the present invention includes a) holding a substrate jig by the hand, the substrate jig having a lower surface provided with three optical sensors that are arranged nonlinearly, b) causing the substrate rotation mechanism to rotate the substrate holder to form a circular rotation trajectory of a mark provided in advance on the substrate, and c) calculating a position of the hand relative to the substrate holder in plan view in accordance with the position of the hand relative to the rotation trajectory obtained from each of the three optical sensors of the substrate jig located above the substrate holder and generating horizontal teaching information that indicates an adequate relationship between relative positions of the hand and the substrate holder in plan view.

The present invention is also intended for a teaching set for use in a substrate processing apparatus that includes a processing unit that performs predetermined processing on a substrate and a transport robot that transports the substrate to the processing unit, the teaching set being used to teach a substrate transport position of the transport robot in the processing unit to the transport robot. The processing unit includes a substrate holder that holds the substrate in a horizontal position, a substrate rotation mechanism that rotates the substrate holder about a rotation axis pointing in an up-down direction, and the transport robot including a hand that transfers the substrate to and from the substrate holder. A teaching set according to one preferable embodiment of the present invention includes a substrate jig having a lower surface provided with three optical sensors that are arranged nonlinearly, and a storage medium that stores a program for generating horizontal teaching information that indicates an adequate relationship between relative positions of the hand and the substrate holder in plan view. When the hand located above the substrate holder holds the substrate jig, the substrate rotation mechanism rotates the substrate holder to form a circular rotation trajectory of a mark provided in advance on the substrate holder. The program is executed by a computer to calculate a position of the hand relative to the substrate holder in plan view in accordance with the position of the hand relative to the rotation trajectory obtained from each of the three optical sensors and to generate the horizontal teaching information.

The present invention is also intended for a substrate jig for use in a substrate processing apparatus to generate teaching information, the substrate processing apparatus including a processing unit that performs predetermined processing on a substrate and a transport robot that transports the substrate to the processing unit, the teaching information teaching a substrate transport position of the transport robot in the processing unit. A substrate jig according to one preferable embodiment of the present invention includes a generally disk-shaped jig body, and three optical sensors arranged nonlinearly on a lower surface of the jig body. The processing unit includes a substrate holder that holds the substrate in a horizontal position, and a substrate rotation mechanism that rotates the substrate holder about a rotation axis pointing in an up-down direction. The transport robot includes a hand that transfers the substrate to and from the substrate holder. The generation of the teaching information includes a) causing the hand to hold the substrate jig, b) causing the substrate rotation mechanism to rotate the substrate holder to form a circular rotation trajectory of a mark provided in advance on the substrate holder, and c) calculating a position of the hand relative to the substrate holder in plan view in accordance with the position of the hand relative to the rotation trajectory obtained from each of the three optical sensors of the substrate jig that is located above the substrate holder and generating horizontal teaching information that indicates an adequate relationship between relative positions of the hand and the substrate holder in plan view.

Preferably, the substrate jig further includes a contact sensor that is provided on the lower surface of the jig body and that detects contact with the substrate holder. The substrate holder is a mechanical chuck that mechanically holds an outer peripheral portion of the substrate jig by a plurality of chuck pins that are arranged circularly. The generation of the teaching information further includes d) after the operation c), moving the hand closer to the substrate holder in an up-down direction to generate vertical teaching information that indicates an adequate relationship between relative positions of the hand and the substrate holder in the up-down direction in accordance with an output from the contact sensor. The contact sensor is arranged at a position other than where the contact sensor comes in contact with the hand, on an outer peripheral portion of the lower surface of the substrate jig.

These and other objects, features, aspects and advantages of the present invention will become more apparent from the following detailed description of the present invention when taken in conjunction with the accompanying drawings.

DESCRIPTION OF EMBODIMENTS

Figure 1:
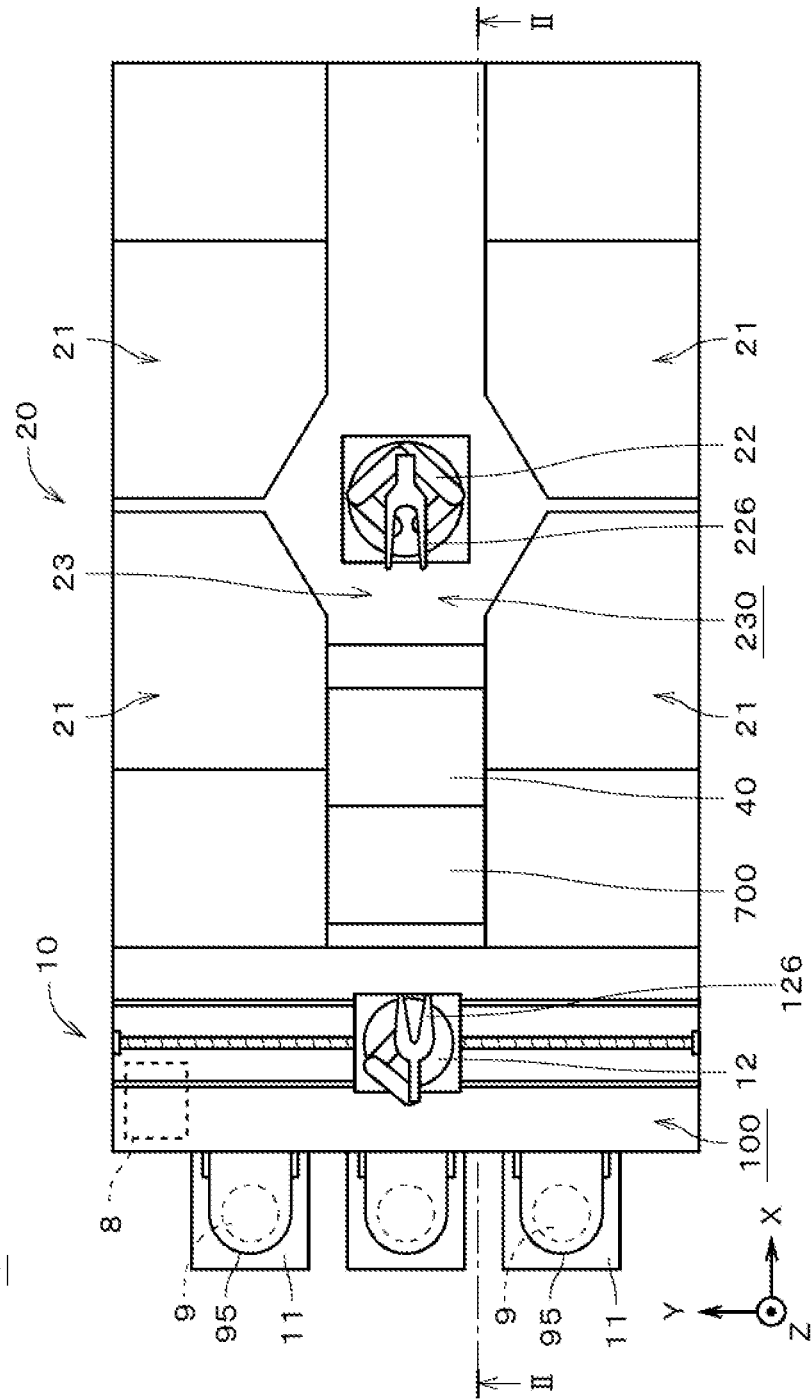
FIG. 1 is a plan view of a substrate processing apparatus according to one embodiment.
Figure 2:
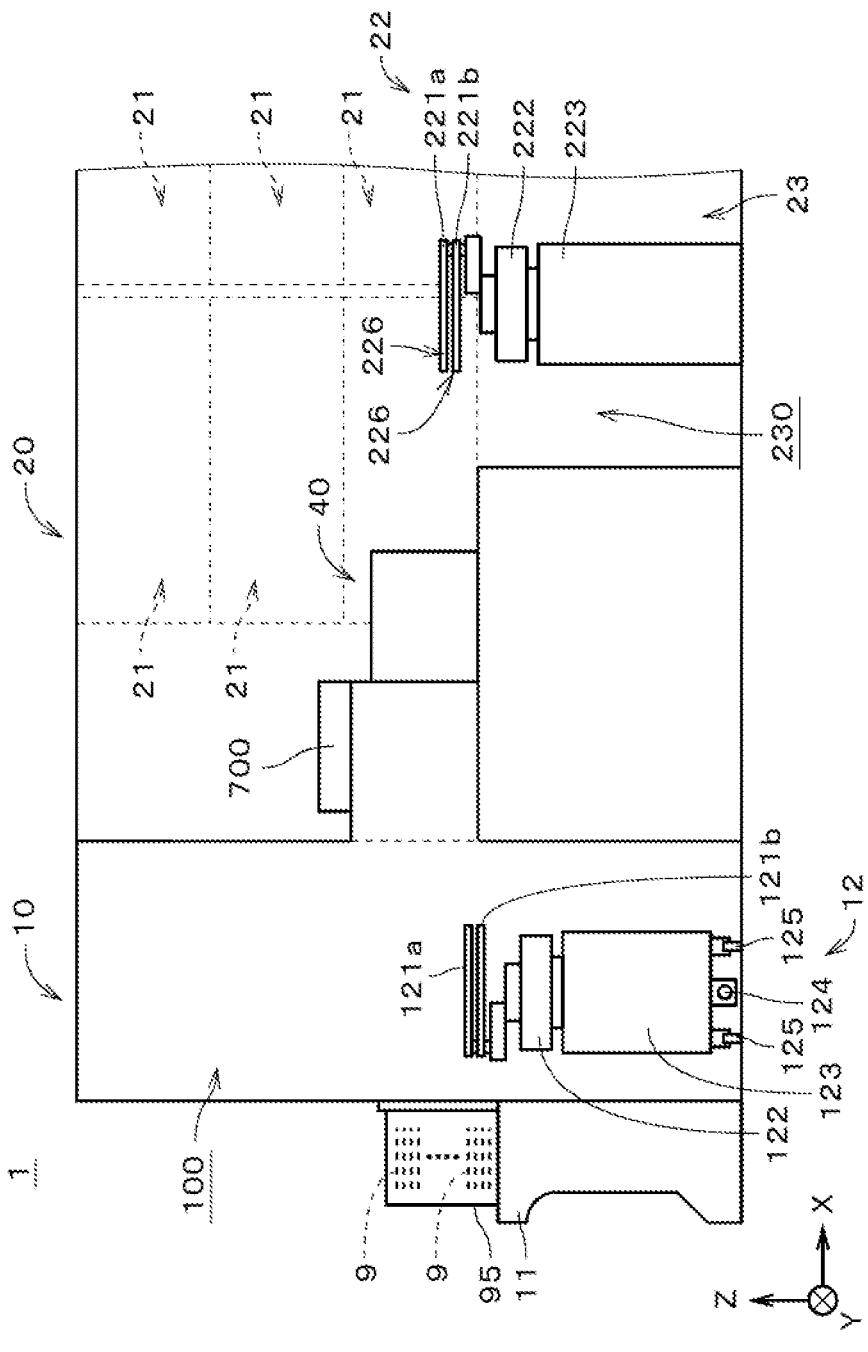
FIG. 2 is a front view showing the inside of the substrate processing apparatus.

FIG. 1 is a plan view of a substrate processing apparatus 1 according to one embodiment of the present invention. FIG. 2 is a diagram showing the substrate processing apparatus 1 as viewed from the line II-II in FIG. 1. Note that each drawing to be referenced hereinafter is appropriately provided with an orthogonal coordinate system XYZ in which the Z axis direction corresponds to the vertical direction (i.e., the up-down direction) and the XY plane corresponds to a horizontal plane. In FIG. 2, part of the substrate processing apparatus 1 on the (+X) side is not shown.

The substrate processing apparatus 1 is an apparatus that continuously performs processing on a plurality of generally disk-shaped semiconductor substrates 9 (hereinafter, simply referred to as "substrates 9"). The substrate processing apparatus 1 performs, for example, liquid processing for supplying a processing liquid to the substrates 9.

The substrate processing apparatus 1 includes a plurality of carrier stages 11, an indexer block 10, a processing block 20, a placement unit 40, and a computer 8. The indexer block 10 and the processing block 20 are also referred to as an indexer cell and a processing cell, respectively. The indexer block 10 is also referred to as, for example, an equipment front end module (EFEM) unit. In the example illustrated in FIG. 1, a plurality of (e.g., three) carrier stages 11, the indexer block 10, and the processing block 20 are arranged adjacent to one another in the order specified from the (−X) side to the (+X) side.

The carrier stages 11 are aligned in the Y direction along the side wall on the (−X) side of the indexer block 10. Each carrier stage 11 is a placement stage on which a carrier 95 is placed. The carrier 95 is capable of storing a plurality of disk-shaped substrates 9. The side wall on the (−X) side of the indexer block 10 has openings at positions that correspond to the positions of the carriers 95 placed on the carrier stages 11. Each opening is provided with a carrier shutter that is opened and closed when substrates 9 are transported into and out of the corresponding carrier 95.

For each carrier stage 11, a carrier 95 that stores a plurality of unprocessed substrates 9 is transported in from outside the substrate processing apparatus 1 and placed on the carrier stage 11 by, for example, an overhead hoist transport (OHT). Processed substrates 9 that have undergone processing performed in the processing block 20 are stored again in the carrier 95 placed on the carrier stage 11. The carrier 95 storing the processed substrates 9 is transported to the outside of the substrate processing apparatus 1 by, for example, an OHT. That is, the carrier stages 11 function as substrate collectors that collect unprocessed substrates 9 and processed substrates 9.

The carriers 95 may, for example, be front opening unified pods (FOUPs) that store substrates 9 in their enclosed space. The carriers 95 are, however, not limited to FOUPs, and may, for example, be standard mechanical interface (SMIF) pods or open cassettes (OCs) that expose stored substrates 9 to the outside air. The number of carrier stages 11 may be one or two or more.

The indexer block 10 receives an unprocessed substrate 9 from a carrier 95 and transfers the substrate 9 to the processing block 20. The indexer block 10 also receives a processed substrate 9 transported out of the processing block 20 and transports the substrate 9 into a carrier 95. The indexer block 10 has an indexer robot 12 arranged in its internal space 100, the indexer robot 12 being a robot that transports a substrate 9 into and out of a carrier 95.

The indexer robot 12 includes two transport arms 121*a* and 121*b*, an arm stage 122, and a movable mount 23. The two transport arms 121*a* and 121*b* are mounted on the arm stage 122. The movable mount 23 has screw-threaded engagement with a ball screw 124 that extends in parallel with the direction of alignment of the carrier stages 11 (i.e., in the Y direction), and is provided slidably along two guide rails 125. When the ball screw 124 is rotated by a rotary motor (not shown), the indexer robot 12 as a whole including the movable mount 23 moves horizontally in the Y direction.

The arm stage 122 is mounted on the movable mount 23. The movable mount 23 includes a motor (not shown) that rotates the arm stage 122 about a rotation axis pointing in the up-down direction (i.e., Z direction) and a motor (not shown) that moves the arm stage 122 in the up-down direction. The transport arms 121*a* and 121*b* are arranged vertically apart from each other on the arm stage 122.

The transport arms 121*a* and 121*b* are each provided with a generally U-shaped hand 126 at their tip as viewed in plan view. Each hand 126 includes, for example, a base that expands in the width direction and two lugs that extend in generally parallel with the longitudinal direction perpendicular to the width direction from both ends in the width direction of the base. Each of the transport arms 121*a* and 121*b* supports the lower surface of a single substrate 9 with its hand 126. Each hand 126 is provided with a mobility limitation mechanism (not shown) and fixes the position of the substrate 9 relative to the hand 126 with high positioning accuracy. For example, the mobility limitation mechanism may be configured by a plurality of projections or the like that come in contact with the side edge of a substrate 9 and mechanically limit the position of the substrate 9, or may be configured by a plurality of suction ports that absorb the lower surface of a substrate 9.

The transport arms 121a and 121b move independently of each other in the horizontal direction (i.e., in the radial direction about the rotation axis of the arm stage 122), as a result of an articulated mechanism being expanded and contracted by a drive mechanism (not shown) included in the arm stage 122. In other words, the hands 126 of the indexer robot 12 are capable of back-and-forth movement, up-and-down movement, and rotation. Note that the number of transport arms of the indexer robot 12 may be one or three or more.

The indexer robot 12 controls the transport arms 121a and 121b, each holding a substrate 9 with their hand 126, to individually access the placement unit 40 and the carriers 95 placed on the carrier stages 11 so as to transport the substrates 9 between the placement unit 40 and the carriers 95. The movement mechanism of the indexer robot 12 described above is not limited to the one described in the above example, and may be any other mechanism. For example, a belt feed mechanism using a pulley and a timing belt may be adopted as a mechanism for moving the transport arms 121a and 121b in the up-down direction.

The processing block 20 includes a transport path 23 used to transport substrates 9, and a plurality of processing units 21 arranged around the transport path 23. In the example illustrated in FIG. 1, the transport path 23 extends in the X direction at the center in the Y direction of the processing block 20. The transport path 23 has a center robot 22 arranged in its internal space 230, the center robot 22 being a robot that transports a substrate 9 into and out of each processing unit 21.

The center robot 22 includes two transport arms 221a and 221b, an arm stage 222, and a mount 223. The two transport arms 221a and 221b are mounted on the arm stage 222. The mount 223 is fixed to the frame of the processing block 20. Thus, the mount 223 of the center robot 22 moves in neither the horizontal direction nor the up-down direction. Alternatively, the mount 223 of the center robot 22 may be configured to be movable in, for example, the horizontal direction.

The arm stage 222 is mounted on the mount 223. The mount 223 includes a motor (not shown) that rotates the arm stage 222 about a rotation axis pointing in the up-down direction, and a motor (not shown) that moves the arm stage 222 in the up-down direction. The transport arms 221a and 221b are arranged vertically apart from each other on the arm stage 222.

Figure 3:
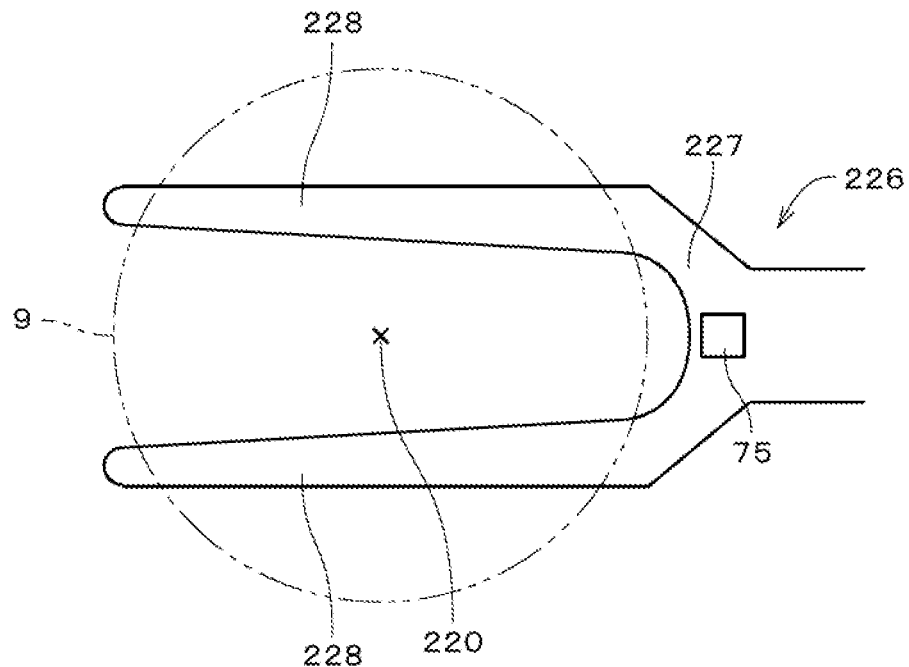
FIG. 3 is a plan view showing an area in the vicinity of a transport arm in enlarged dimensions.

The transport arms 221a and 221b are each provided with a generally U-shaped hand 226 at their tip as viewed in plan view. FIG. 3 is a plan view showing an area in the vicinity of the hand 226 of the transport arm 221a in enlarged dimensions. The hand 226 of the transport arm 221b also has a structure similar to that illustrated in FIG. 3.

The hand 226 illustrated in FIG. 3 includes a base 227 that expands in the width direction, and two lugs 228 that extend in generally parallel with the longitudinal direction perpendicular to the width direction from both ends in the width direction of the base 227. The hand 226 is provided with a mobility limitation mechanism (not shown) and fixes the position of a substrate 9 relative to the hand 226 with high positioning accuracy. For example, the mobility limitation mechanism may be configured by a plurality of projections or the like that come in contact with the side edge of a substrate 9 and mechanically limit the position of the substrate 9, or may be configured by a plurality of suction ports that absorb the lower surface of a substrate 9.

Each of the transport arms 221a and 221b holds a single substrate 9 with its hand 226. The position indicated by the cross in FIG. 3 corresponds to the position of the center of the hand 226, i.e., a hand center position 220. The hand center position 220 is a virtual point located between the two lugs 228. The hand center position 220 is the position that the center of a substrate 9 is located at in plan view when the substrate 9 is held at a design position (i.e., the position indicated by the dashed double-dotted line in FIG. 3) by the hand 226.

The transport arms 221a and 221b move independently of each other in the horizontal direction (i.e., in the radial direction about the rotation axis of the arm stage 222), as a result of an articulated mechanism being expanded and contracted by a drive mechanism (not shown) included in the arm stage 222. In other words, the hands 226 of the center robot 22 are capable of back-and-forth movement, up-and-down movement, and rotation. Note that the number of transport arms of the center robot 22 may be one or three or more.

The center robot 22 is a transport robot that controls the transport arms 221a and 221b, each holding a substrate 9 with their hand 226, to individually access the placement unit 40 and the processing units 21 so as to transport the substrates 9 between the placement unit 40 and the processing units 21. The aforementioned movement mechanism of the center robot 22 is not limited to the one described in the above example, and may be any other mechanism. For example, a belt feed mechanism using a pulley and a timing belt may be adopted as a mechanism for moving the transport arms 221a and 221b in the up-down direction.

Each processing unit 21 performs predetermined processing on substrates 9. In the example illustrated in FIGS. 1 and 2, the processing block 20 includes 12 processing units 21. Specifically, four sets of three processing units 21 stacked in the Z direction are arranged around the center robot 22 as viewed in plan view. The number of processing units 21 included in the processing block 20 may be changed within the range of values greater than 1.

The placement unit 40 is provided at the joint between the indexer block 10 and the processing block 20. As described previously, the indexer robot 12 and the center robot 22 are accessible to the placement unit 40. The placement unit 40 is connected to the processing units 21 via the transport path 23 in which the center robot 22 is arranged.

The indexer robot 12 places an unprocessed substrate 9 transported out of a carrier 95 on the placement unit 40. The center robot 22 transports an unprocessed substrate 9 out from the placement unit 40 into a processing unit 21. The center robot 22 also places a processed substrate 9 transported out of a processing unit 21 on the placement unit 40. The indexer robot 12 transports a processed substrate 9 out from the placement unit 40 into a carrier 95. In other words, the placement unit 40 holds an unprocessed substrate 9 transferred from the indexer robot 12 to the center robot 22 and a processed substrate 9 transferred from the center robot 22 to the indexer robot 12.

Figure 4:
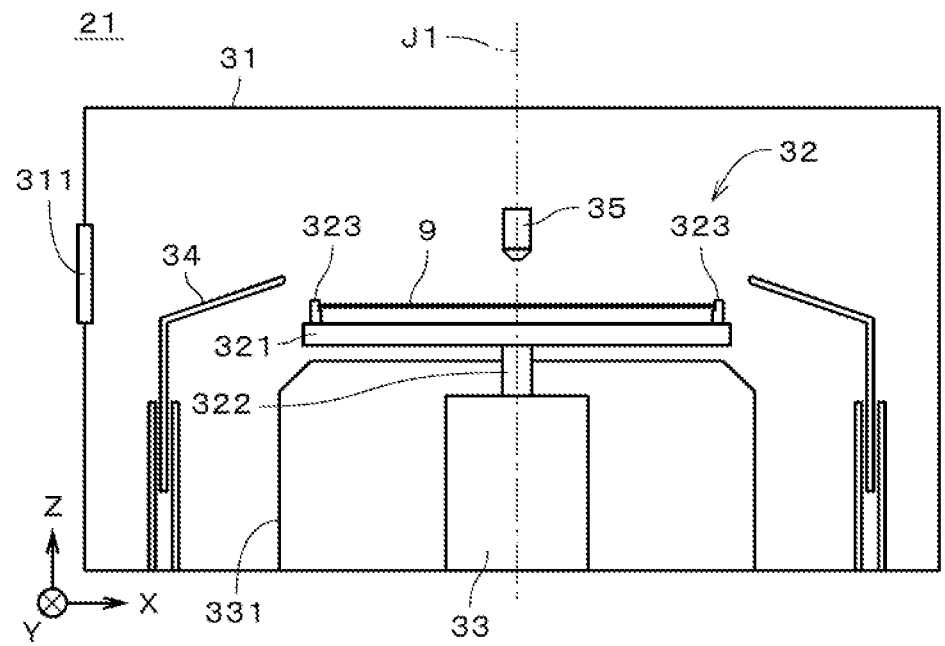
FIG. 4 is a diagram showing one example of a processing unit.

FIG. 4 is a diagram showing one example of a processing unit 21. The processing unit 21 includes a housing 31, a substrate holder 32, a substrate rotation mechanism 33, a cup part 34, and a processing nozzle 35. The substrate holder 32, the substrate rotation mechanism 33, the cup part 34, and the processing nozzle 35 are housed inside the housing 31. The side wall of the housing 31 has an opening 311 through which a substrate 9 is transported in by the center robot 22 (see FIGS. 1 and 2). The opening 311 is capable of being opened and closed; it is opened during transport of the substrate 9 into and out of the housing 31 and is closed during processing of the substrate 9. The processing unit 21 performs, for example, liquid processing such as processing for cleaning the substrate 9.

In the example illustrated in FIG. 4, the substrate holder 32 is a mechanical chuck that holds a substrate 9 in a horizontal position. The substrate holder 32 includes a base 321, a shaft 322, and a plurality of chuck pins 323. The base 321 is a generally disk-shaped member having a rotation axis J1 pointing in the up-down direction as its center. The following example is given on the assumption that the up-down direction in FIG. 4 agrees with the aforementioned Z direction, but the up-down direction in FIG. 4 does not necessarily have to agree with the Z direction. The shaft 322 is a generally cylindrical or columnar member having the rotation axis J1 as its center. The shaft 322 extends downward from the lower surface of the base 321 and is connected to the substrate rotation mechanism 33.

Figure 5:
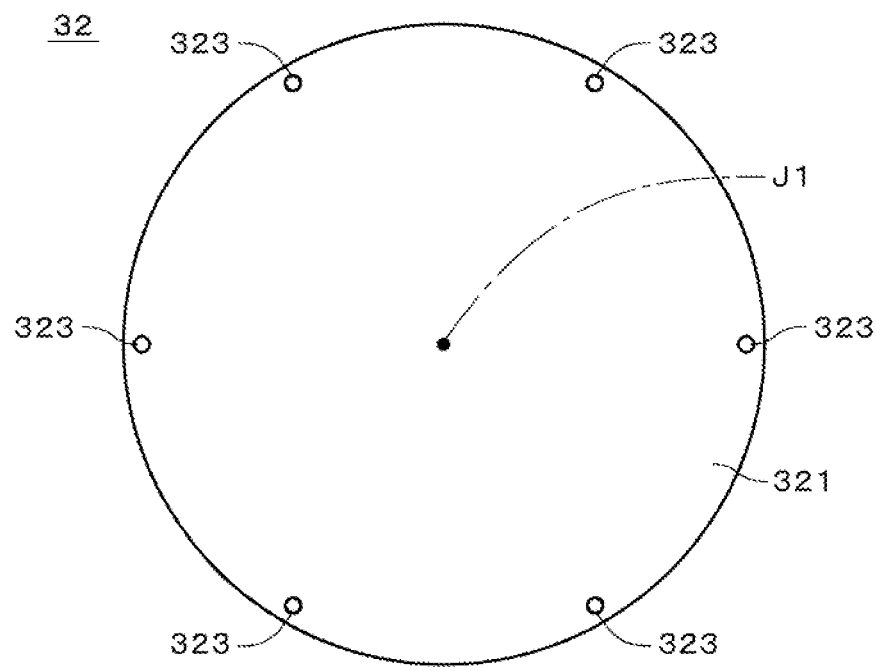
FIG. 5 is a plan view of a substrate holder.

FIG. 5 is a plan view of the substrate holder 32. As illustrated in FIGS. 4 and 5, the plurality of (e.g., six) chuck pins 323 are provided upright on the upper surface of the base 321. The chuck pins 323 are circularly arranged on an outer peripheral portion of the upper surface of the base 321. To be more specific, the chuck pins 323 are arranged on the circumference of the same circle about the rotation axis J1. For example, the chuck pins 323 are arranged at generally equiangular intervals in the circumferential direction about the rotation axis J1 (hereinafter, also simply referred to as the "circumferential direction"). The chuck pins 323 come in direct contact with the outer peripheral portion of a substrate 9 and mechanically hold the outer peripheral portion of the substrate 9. When a substrate 9 is held by the chuck pins 323, the upper surface of the base 321 faces the lower surface of the substrate 9 in the up-down direction while being spaced downward apart from the lower surface of the substrate 9.

The substrate rotation mechanism 33 rotates the substrate holder 32 about the rotation axis J1 so as to rotate a substrate 9 held by the substrate holder 32. The substrate rotation mechanism 33 may, for example, be an electric motor connected to the shaft 322 of the substrate holder 32. Alternatively, the substrate rotation mechanism 33 may be any rotation mechanism other than an electric motor. The substrate rotation mechanism 33 is housed inside a cover 331 provided below the substrate holder 32.

The processing nozzle 35 ejects a processing liquid toward the upper surface of a substrate 9 from above the substrate 9. In FIG. 4, a configuration that supports the processing nozzle 35 above a substrate 9 is not shown. The cup part 34 is a generally cylindrical member that surrounds all around the circumference of the substrate holder 32. The cup part 34 is a liquid receiver that receives a processing liquid or the like dispersed throughout the surroundings from a rotating substrate 9. The cup part 34 is movable in the up-down direction by a cup elevating mechanism (not shown). When a substrate 9 is processed, the cup part 34 is arranged at a position facing the side edge of the substrate 9 in the radial direction about the rotation axis J1 (hereinafter, also simply referred to as the "radial direction") as illustrated in FIG. 4. When a substrate 9 is transferred between the substrate holder 32 and the hand 226 of the center robot 22, the cup part 34 moves downward from the position illustrated in FIG. 4. In the example illustrated in FIG. 4, the cup part 34 does not rotate, but the cup part 4 may be configured to be rotatable about the rotation axis J1.

Figure 6:
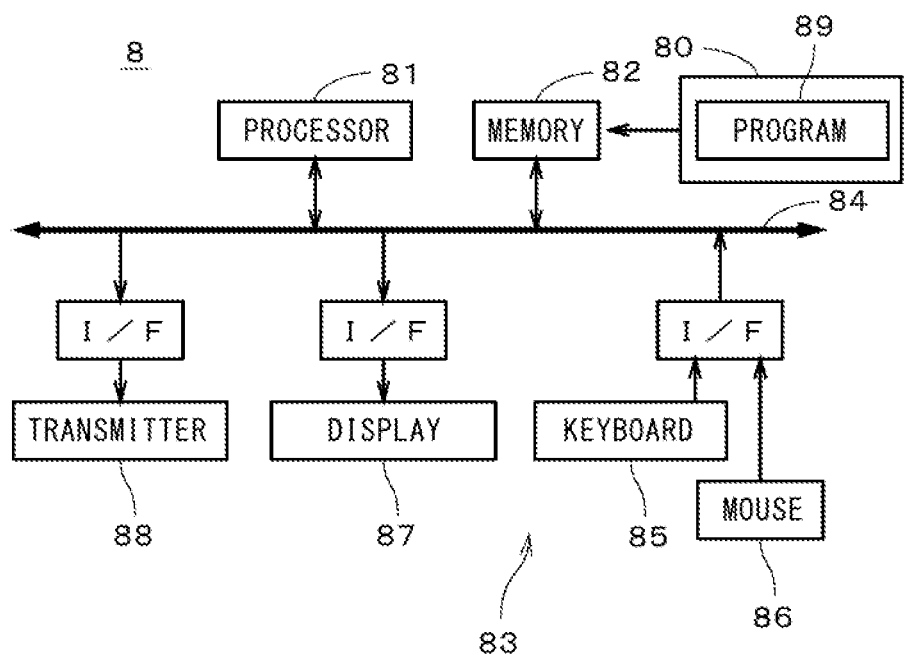
FIG. 6 is a diagram illustrating a configuration of a computer.

FIG. 6 is a diagram showing a configuration of the computer 8. The computer 8 is an ordinary computer that includes a processor 81, a memory 82, an input/output part 83, and a bus 84. The bus 84 is a signal circuit that connects the processor 81, the memory 82, and the input/output part 83. The memory 82 stores various types of information. For example, the memory 82 may read out and stores a program 89 that is stored in advance in a storage medium 80 for generation of teaching information. The generation of the teaching information will be described later in detail. The processor 81 executes a variety of processing (e.g., numerical calculation) using the memory 82 or other constituent elements in accordance with the aforementioned program 89 or any other data stored in the memory 82. The input/output part 83 includes a keyboard 85 and a mouse 86 that accept input from an operator, a display 87 that displays output or the like from the processor 81, and a transmitter 88 that transmits output or the like from the processor 81.

Figure 7:
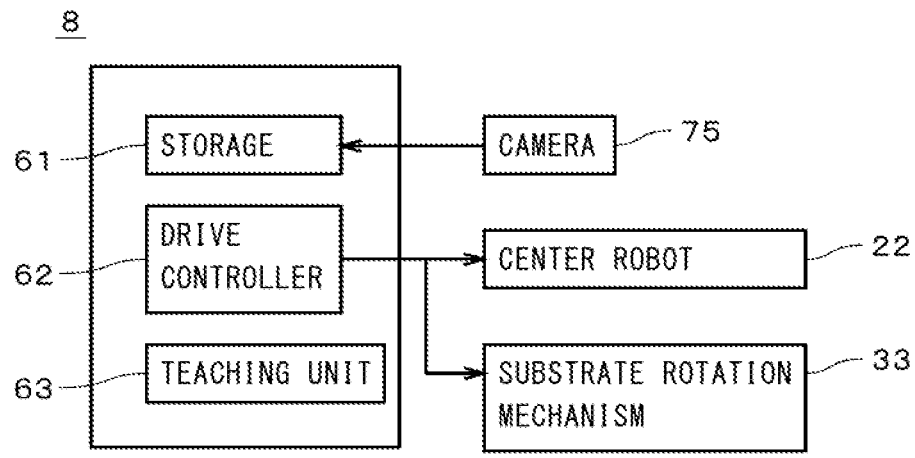
FIG. 7 is a block diagram illustrating functions implemented via the computer.

FIG. 7 is a block diagram showing functions implemented by the computer 8 executing the aforementioned program 89. The substrate processing apparatus 1 includes a storage 61, a drive controller 62, and a teaching unit 63 as the functions implemented via the computer 8. The storage 61 is mainly implemented via the memory 82 and stores various types of information such as an output from a camera 75, which will be described later. The drive controller 62 is mainly implemented via the processor 81 and the transmitter 88 and controls drive of each constituent element such as the center robot 22 and the processing unit 21 by transmitting a control signal to the constituent element.

The teaching unit 63 teaches an adequate position to which a substrate 9 is to be transported by the center robot 22 (i.e., substrate transport position), to the center robot 22 during transport of the substrate 9 into and out of a processing unit 21 by the center robot 22. The teaching unit 63 generates teaching information that indicates the substrate transport position in the processing unit 21 to which a substrate is transported by the center robot 22.

The teaching information includes horizontal teaching information that indicates an adequate relationship between the relative positions of the substrate holder 32 and the hand 226 of the center robot 22 in a processing unit 21 in plan view. The teaching information also includes vertical teaching information that indicates an adequate relationship between the relative positions of the substrate holder 32 and the hand 226 of the center robot 22 in a processing unit 21. The teaching information further includes carry-in teaching information that indicates an adequate relationship between the relative positions of the hand 226 of the center robot 22 and the opening 311 of the housing 31 in a processing unit 21.

The horizontal teaching information is used to locate the hand 226 of the center robot 22 at an adequate position relative to the substrate holder 32 in plan view when a substrate 9 is transferred from the hand 226 to the substrate holder 32 and when the hand 226 receives a substrate 9 from the substrate holder 32. The vertical teaching information is used to locate the hand 226 of the center robot 22 at an adequate position relative to the substrate holder 32 in the vertical direction when a substrate 9 is transferred from the hand 226 to the substrate holder 32 and when the hand 226 receives a substrate 9 from the substrate holder 32. The carry-in teaching information is used to locate the hand 226 of the center robot 22 at an adequate position relative to the opening 311 (i.e., at a position where the substrate 9 held by the hand 226 does not collide with the housing 331 or other constituent elements) when the hand 226 is inserted in the opening 311 of the housing 31 and when the hand 226 is moved away from the opening 311. In other words, the carry-in teaching information is information for preventing the collision of a substrate 9 when the substrate 9 is transported into and out of the housing 31 by the hand 226 of the center robot 22.

Figure 8:
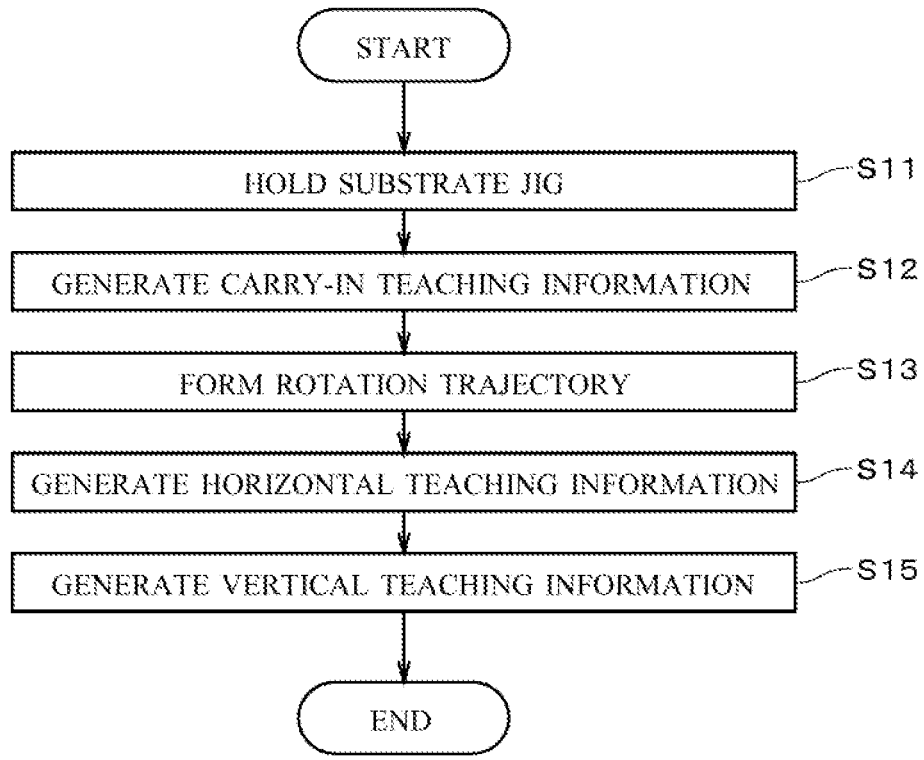
FIG. 8 is a flowchart of generation of teaching information.

Next, a procedure for generating teaching information will be described with reference to FIG. 8. The teaching information is generated automatically while the substrate processing apparatus 1 is not performing processing on substrates 9 (e.g., at nighttime). The generation of the teaching information is sequentially conducted for the plurality of processing units 21 in the substrate processing apparatus 1. The generation of the teaching information is also sequentially conducted for the plurality of hands 226 of the center robot 22. Hereinafter, a case is described in which the teaching information for the hand 226 of the upper transport arm 221*a* of the center robot 22 is generated. As will be described later, the teaching information for the hand 226 of the transport arm 221*b* will also be generated using the same procedure.

Figure 9:
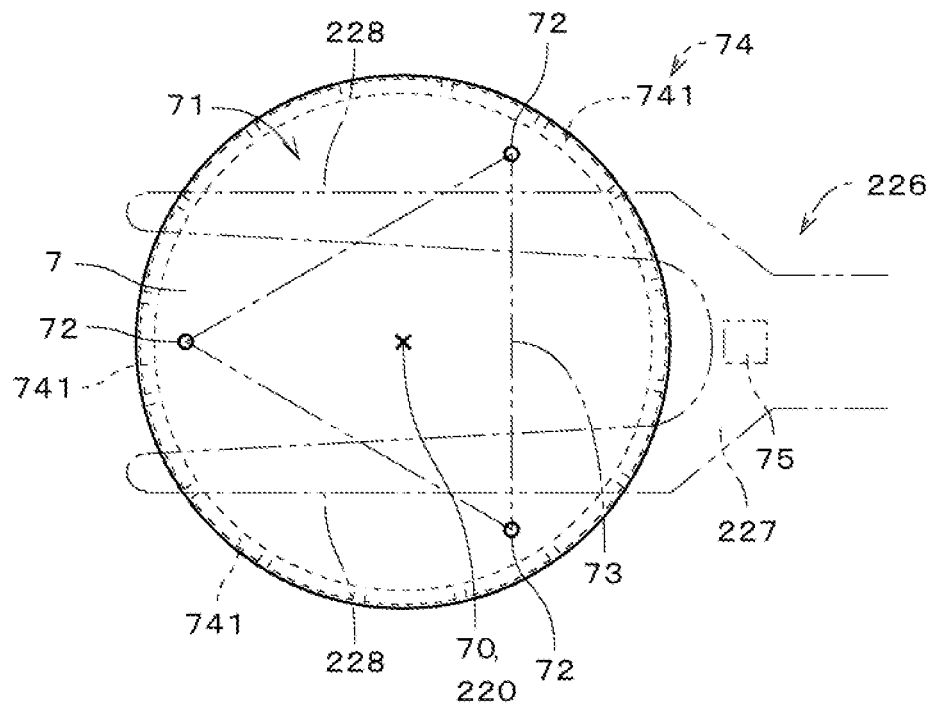
FIG. 9 is a bottom view of a substrate jig.

In the generation of the teaching information, first, a substrate jig 7 illustrated in FIG. 9 is held by the hand 226 of the center robot 22 illustrated in FIGS. 1 and 2 (step S11). Specifically, the drive controller 62 (see FIG. 7) controls the center robot 22 to drive the transport arm 221*a* so that the hand 226 is inserted into a storage shed 700 arranged in the vicinity of the placement unit 40. The storage shed 700 has one or more substrate jigs 7 stored in advance. The hand 226 holds one substrate jig 7 and takes the substrate jig 7 out of the storage shed 700. Note that the substrate jig 7 may be placed on the hand 226 by an operator or any other means.

FIG. 9 is a bottom view of a lower surface 71 of the substrate jig 7 (i.e., the lower surface held by the hand 226). The substrate jig 7 may, for example, be a generally disk-shaped member. For example, the substrate jig 7 has a generally circular shape that is approximately the same as the shape of a substrate 9 in plan view. The substrate jig 7 preferably has a thickness smaller than the height of a vertical space (hereinafter, also referred to as a "hand space") between the hand 226 of the transport arm 221*a* and the hand 226 of the transport arm 221*b*. This allows the hand 226 to easily hold the substrate jig 7 during generation of the teaching information for the hand 226 of the lower transport arm 221*b*.

The substrate jig 7 includes a generally disk-shaped jig body 76 and three optical sensors 72 provided on the lower surface 71 of the jig body 76. Each optical sensor 72 is a sensor that is a combination of an optical lens system and an optical sensor. As the optical sensors 72, for example, various devices can be used, such as photosensors or cameras provided with a CMOS or CCD sensor. In the present embodiment, photosensors are used as the optical sensors 72. In the following description, the configuration given by the reference sign 72 is referred to as a photosensor 72.

The three photosensors 72 are not arranged in a straight line, but are arranged at three vertices of a triangle in plan view. In other words, the three photosensors 72 are arranged nonlinearly. The three photosensors 72 are arranged such that the barycenter of a virtual triangle 73 configured by the three photosensors 72 overlaps with a center 70 of the substrate jig 7 in plan view. The triangle 73 configured by the three photosensors 72 may or may not be any of an equilateral triangle, an isosceles triangle, and a right-angled triangle. In the present embodiment, the triangle 73 is an equilateral rectangle. Note that the lower surface 71 of the substrate jig 7 may be provided with four or more photosensor 72. Among the four or more photosensors 72, at least three photosensors 72 are arranged nonlinearly as described above.

In FIG. 9, the hand 226 that comes in contact with the lower surface 71 of the substrate jig 7 and holds the substrate jig 7 from the underside is indicated by the dashed double-dotted line. When the substrate jig 7 is held by the hand 226, the aforementioned mobility limitation mechanism fixes the position of the substrate jig 7 relative to the hand 226 with high positioning accuracy. When the substrate jig 7 is held by the hand 226, the center 70 of the substrate jig 7 overlaps with the hand center position 220 of the hand 226 in plan view. The three photosensors 72 are arranged to avoid the two lugs 228 of the hand 226 in plan view and do not overlap with the hand 226. Each photosensor 72 is capable of detecting a target object located below the hand 226.

Each photosensor 72 is a reflection-type photosensor (i.e., photo reflector). As will be described later, the target objects of the photosensors 72 in the present embodiment are the chuck pins 323 (FIGS. 4 and 5), which project upward from the base 321 of the substrate holder 32. The photosensors 72 are preferably limited reflection-type photosensors capable of detecting only an object located within a predetermined range of distances. Alternatively, the photosensors 72 may also be photosensors of a different type other than the limited reflection-type photosensors.

As will be described later, the substrate jig 7 that has been transported into a processing unit 21 is transferred from the hand 226 to the substrate holder 32 and held by the substrate holder 32. The lower surface 71 of the substrate jig 7 is provided with a contact sensor 74 that detects contact with the substrate holder 32. The contact sensor 74 is provided circularly on the outer circumferential portion of the lower surface 71 of the substrate 9. The contact sensor 74 is located radially outward of the three photosensors 72 and surrounds the three photosensors 72. In the example illustrated in FIG. 9, the contact sensor 74 includes a plurality of (e.g., 16) sensor elements 741. The sensor elements 741 are arranged circularly about the center 70 of the substrate jig 7 on the outer peripheral portion of the lower surface 71 of the substrate jig 7. For example, the sensor elements 741 may be arranged at generally equiangular intervals in the circumferential direction. The sensor elements 741 may, for example, be pressure sensors, piezoelectric sensors, or capacitance sensors.

The supply of power to the photosensors 72 and the contact sensor 74 described above may be implemented via, for example, a thin battery included in the substrate jig 7. Alternatively, power may be supplied from an external power source located outside the substrate jig 7 to the photosensors 72 and the contact sensor 74 via cables or wirelessly. Outputs from the photosensors 72 and the contact sensor 74 are transmitted to the computer 8.

The hand 226 that holds the substrate jig 7 is provided with a camera 75. The camera 75 may, for example, be detachably mounted at a predetermined position on the hand 226 with a fastener or any other means, or may be undetachably fixed at a predetermined position on the hand 226. In the example illustrated in FIG. 9, the camera 75 is provided on the upper surface of the base 227 of the hand 226 and captures an image of the front of the hand 226 (i.e., in the direction of extension of the lugs 228 from the base 227). Note that the camera 75 may also capture an image of the substrate jig 7 on the hand 226. The image captured by the camera 75 is transmitted to the computer 8 and stored in the storage 61. The camera 75 may, for example, be a CMOS sensor or a CCD sensor. The camera 75 may also be provided on, for example, the upper surface of the substrate jig 7.

When the substrate jig 7 is held by the hand 226 in step S11, the drive controller 62 (see FIG. 7) controls the center robot 22 to drive the transport arm 221a such that the hand 226 is moved toward the opening 311 (see FIG. 4) of one processing unit 21. When the hand 226 approaches the opening 311, the camera 75 captures an image of the opening 311 and the area around the opening 311 in the housing 31 and transmits the captured image to the computer 8.

In the computer 8, the teaching unit 63 obtains the position of the hand 226 relative to the opening 311 in accordance with the captured image (i.e., the image of the opening 311) and the fixed positon of the camera 75 on the hand 226, which is stored in advance in the storage 61. That is, the captured image is an image that indicates the relative positions of the hand 226 and the opening 311. The teaching unit 63 determines, on the basis of the relative positions of the hand 226 and the opening 311, whether or not it is possible to insert a substrate 9 to be held by the hand 226 into the opening 311 without collision with the housing 31.

Then, when it has been determined that the substrate 9 will not collide with the housing 31 when the hand 26 is inserted in the opening 311, the current position of the hand 226 is acquired. On the other hand, when it has been determined that the substrate 9 may possibly collide with the housing 31, the position of the hand 226 relative to the opening 311 is adjusted so as to prevent the substrate 9 from colliding with the housing 31, and the adjusted position of the hand 226 is acquired. Thereafter, the hand 226 is further moved closer to the opening 311 until the hand 226 is inserted in the opening 311, and the operation of adjusting the position of the hand 226 as necessary and acquiring the position of the hand 226 is repeated. Then, the aforementioned carry-in teaching information is generated in accordance with a plurality of acquired positions of the hand 226 (step S12). Specifically, a travel path of the hand 226 passing through these positions of the hand 226 is assumed to be the carry-in teaching information. This carry-in teaching information is stored in the computer 8 and used to process substrates 9 in the substrate processing apparatus 1. This prevents the collision between a substrate 9 and the housing 31 when the substrate 9 is transported into the processing unit 21.

The carry-in teaching information generated in step S12 may also include a travel path to the deepest position in the housing 31 (i.e., the position that the hand 226 can arrive at and that is most away from the opening 311), in addition to the travel path of the hand 226 passing through the opening 311. In this case, after the hand 226 is inserted in the opening 311, the movement of the hand 226, the acquisition of the image indicating the relative positions of the hand 226 and the chuck pins 323, and the adjustment of the position of the hand 226 as needed are repeated in approximately the same manner as described above, and the carry-in teaching information is generated at the point in time when the hand 226 has arrived at the deepest position. This also prevents the collision between the substrate 9 and the chuck pins 323 when the substrate 9 is transported into the processing unit 21.

The carry-in teaching information generated in step S12 is also used to transport the substrate 9 out of the housing 31, and the collision of the substrate 9 with, for example, the chuck pins 323 and the housing 31 is prevented by moving the substrate 9 in the opposite direction of the travel path used to transport the substrate 9 into the housing 31. Note that when the substrate 9 is transported out, in approximately the same manner as described above, the movement of the hand 226, the acquisition of the image indicating the relative positions of the hand 226 and the chuck pins 323 or the housing 31, and the adjustment of the position of the hand 226 as needed may be repeated to generate the carry-in teaching information in approximately the same manner as described above.

Figure 10:
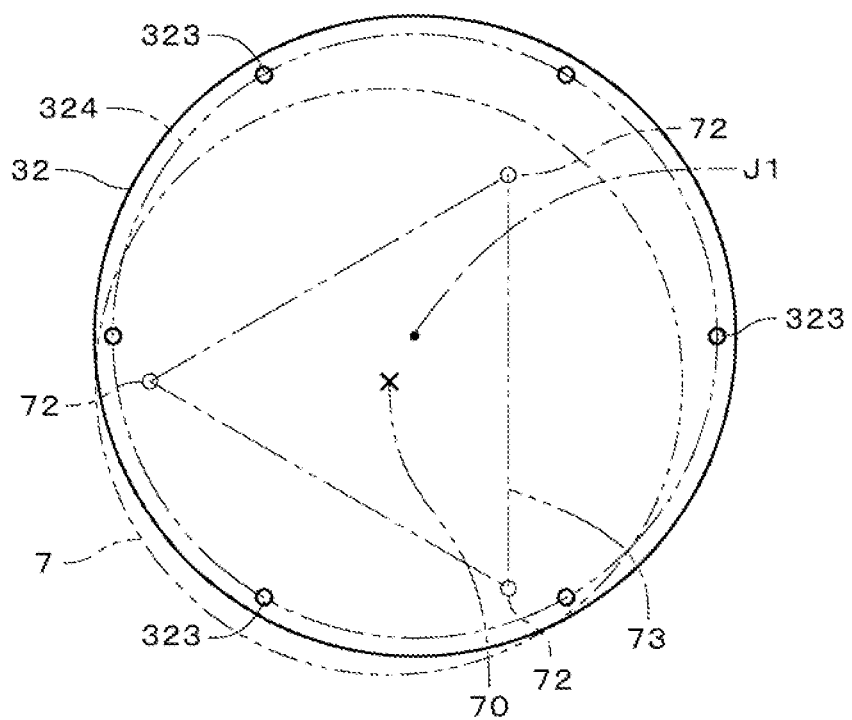
FIG. 10 is a plan view of a substrate holder.

When the carry-in teaching information has been generated, the drive controller 62 controls the center robot 22 to move the substrate jig 7 held by the hand 226 horizontally and locate the substrate jig 7 approximately vertically above the substrate holder 32. At this time, the center 70 of the substrate jig 7 is located in the vicinity of the rotation axis J1 of the substrate holder 32 (i.e., at a design position that is supposed to overlap with the rotation axis J1) in plan view as illustrated in FIG. 10. Note that the substrate holder 32 does not hold any substrate 9 or any other object (e.g., a target jig for teaching).

FIG. 10 is a plan view of the substrate holder 32. To facilitate understanding of the drawing in FIG. 10, the amounts of shift between the center 70 of the substrate jig 7 and the rotation axis J1 of the substrate holder 32 is illustrated greater than the actual amount. In FIG. 10, the substrate jig 7 located above the substrate holder 32, the three photosensors 72, and the virtual triangle 73 formed by the three photosensors 72 are indicated by dashed double-dotted lines. The barycenter of the triangle 73 overlaps with the center 70 of the substrate jig 7 and the hand center position 220 (see FIG. 9) in plan view as described above. In the example illustrated in FIG. 10, the center 70 of the substrate jig 7 is shifted slightly diagonally to the left from the rotation axis J1. However, the amount of the shift of the center 70 of the substrate jig 7 from the rotation axis J1 is unknown at the present moment. In the following description, the position of the substrate jig 7 illustrated in FIG. 10 is referred to as an initial position.

Next, processing for making the center 70 of the substrate jig 7 match the rotation axis J1 in plan view with high accuracy is performed. First, the substrate rotation mechanism 33 is driven under the control of the drive controller 62, and the substrate holder 32 continuously rotates about the rotation axis J1 at a predetermined rotation speed. Accordingly, a virtual circular rotation trajectory 324 is formed by the chuck pins 323 that serve as marks provided in advance on the substrate holder 32 (step S13). Since the chuck pins 323 are arranged on the circumference of the same circle about the rotation axis J1 as described above, the rotation trajectory 324 is a trajectory formed by rotation of the chuck pins 323. Note that the rotation trajectory 324 may, for example, be a trajectory of rotation of upper pin tips of the chuck pins 323 (i.e., portions that come in direct contact with the outer edge portion of a substrate 9 during processing of the substrate 9). In the case where these pin tips are movable in the radial direction, the rotation trajectory 324 may, for example, be a trajectory of rotation of the pin tips that are located on the radially outermost side. The rotation trajectory 324 may also be a trajectory of rotation of portions other than the pin tips of the chuck pins 323. The distance between the rotation axis J1 and the chuck pins 323 (i.e., the radius of the rotation trajectory 324) is known in design, but is handled as an unknown distance in a strict sense.

Note that the marks forming the rotation trajectory 324 are not limited to the chuck pins 323 as long as they are constituent elements provided in advance on the substrate holder 32. For example, screw heads or the like provided on the substrate holder 32 may be used as the marks. The marks may correspond to a single constituent element, or may correspond to a plurality of constituent elements that are arranged on the circumference of the same circle about the rotation axis J1. It is preferable that the marks are not dedicated ones for generating teaching information, and constituent elements of the substrate processing apparatus 1 that are used for processing of substrates 9 or any other purpose, such as the chuck pins 323, are also used as the marks. This simplifies the structure of the substrate holder 32 as compared with the case in which dedicated marks are provided on the substrate holder 32.

Next, while the substrate holder 32 continues to be rotated, the substrate jig 7 is moved horizontally, along with the hand 226, above the substrate holder 32. This horizontal movement continues until one of the three photosensors 72 detects a rotating chuck pin 323 (i.e., until one photosensor 72 overlaps with the rotation trajectory 324 in plan view). Then, the position of the hand 226 is changed little by little to acquire the position at which one photosensor 72 overlaps with the rotation trajectory 324 in plan view and the travel distance from the initial position of the substrate jig 7 is the shortest (this position is hereinafter also referred to as a "minimum travel position"). A distance between the center 70 of the substrate jig 7 located at the initial position and the center 70 of the substrate jig 7 located at the minimum travel position is also acquired (this distance is hereinafter also referred to as a "minimum travel distance"). Thereafter, the minimum travel position of the substrate jig 7 and the minimum travel distance are also acquired for the other two photosensors 72, using the same procedure.

A straight line that passes through the center 70 of the substrate jig 7 located at the initial position and the center 70 of the substrate jig 7 located at the minimum travel position acquired for each photosensor 72 passes through the rotation axis J1, which is the center of the rotation trajectory 324. Therefore, the position of the rotation axis J1, i.e., the center of the rotation trajectory 324, in plan view can be calculated on the basis of the minimum travel distances acquired for the three photosensors 72 and the known relative positions of the three photosensors 72.

Figure 11:
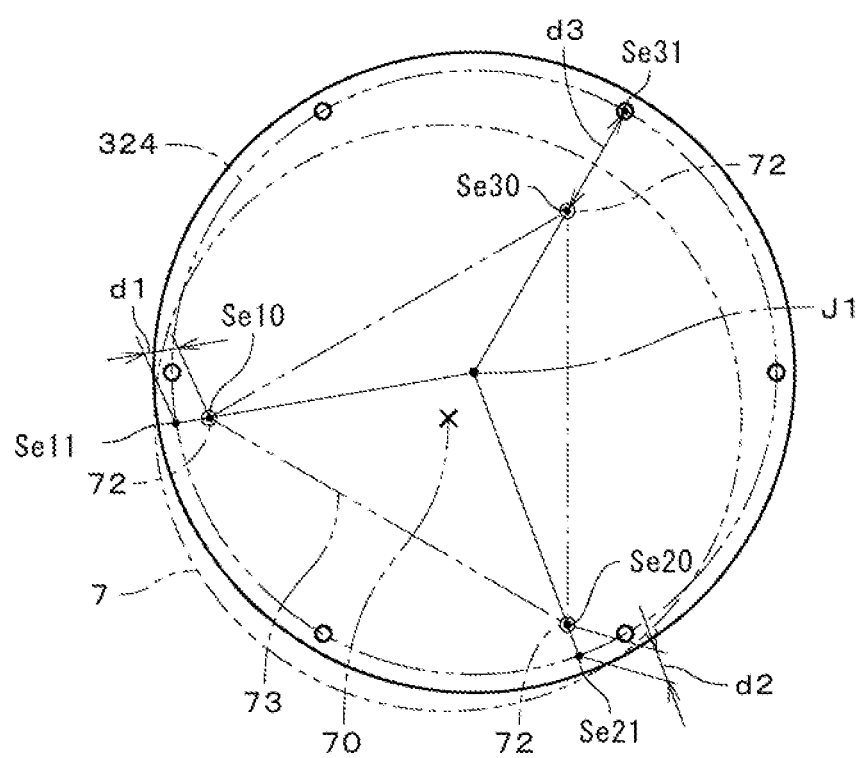
FIG. 11 is a diagram for describing one example of how to obtain horizontal teaching information.

Specifically, first, as illustrated in FIG. 11, coordinates Se10 (i.e., X and Y coordinates; hereinafter, also simply referred to as "coordinates") of one photosensor 72 when the substrate jig 7 is located at the initial position, and a minimum travel distance d1 acquired for this photosensor 72 are used to calculate coordinates Se11 of this photosensor 72 when the substrate jig 7 is located at the minimum travel position acquired for this photosensor 72 (i.e., one coordinates on the rotation trajectory 324). Similarly, coordinates Se21 and Se31 of the other two photosensors 72 (i.e., coordinates on the rotation trajectory 324) when the substrate jig 7 is located at the minimum travel positions are calculated from coordinates Se20 and Se30 of these photosensors 72 when the substrate jig 7 is located at the initial position, and the minimum travel distances d2 and d3 acquired for these photosensors 72.

Figure 12:
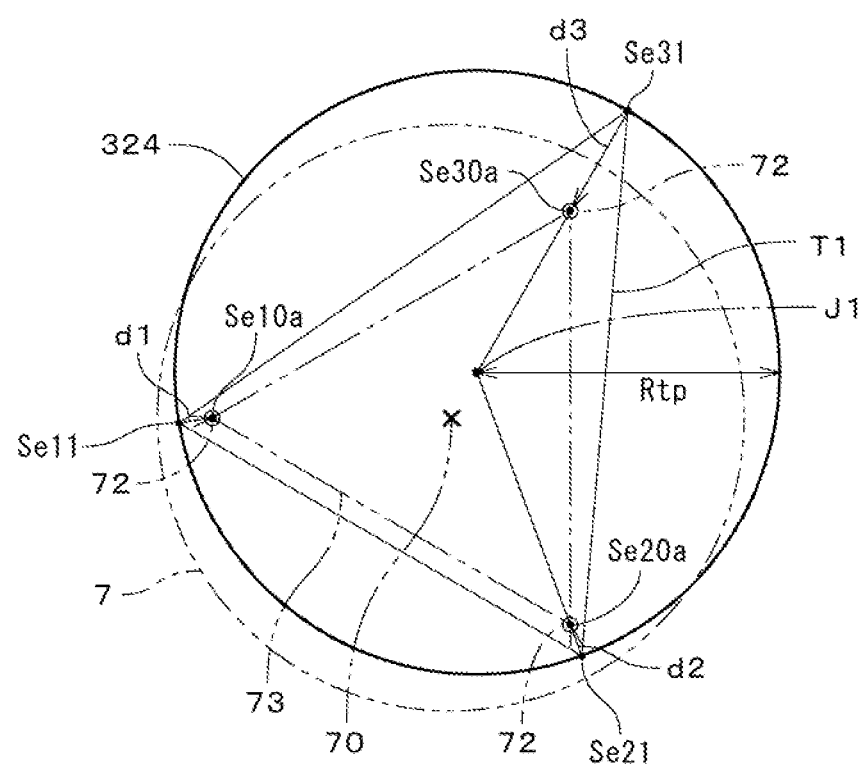
FIG. 12 is a diagram for describing one example of how to obtain the horizontal teaching information.

Then, an inscribed triangle T1 of the rotation trajectory 324 is obtained from the calculated three coordinates Se11, Se21, and Se31 on the rotation trajectory 324 as illustrated in FIG. 12. Then, coordinates at an intersection point of perpendicular bisectors of the sides of the inscribed triangle T1 are calculated as coordinates of the rotation axis J1, i.e., the center of the rotation trajectory 324. Moreover, a radius Rtp of the rotation trajectory 324 is calculated from the lengths of the three sides of the inscribed triangle T1, using the law of sines.

Next, the radius Rtp is changed little by little to calculate back the coordinates Se10a, Se20a, and Se30a of the three photosensors 72 when the substrate jig 7 is located at the initial position, on the basis of the aforementioned coordinates of the rotation axis J1, the radius Rtp of the rotation trajectory 324, and the aforementioned minimum travel distances d1, d2, and d3. Then, the length of each side of the triangle 73 formed by the three photosensors 72 is calculated based on the back-calculated coordinates Se10a, Se20a, and Se30a. Then, a radius Rtp with which the calculated length of each side of the triangle 73 becomes the closest to the (known) length of each side of the triangle 73 for the actual substrate jig 7 is determined as the radius Rt of the rotation trajectory 324. In this way, the radius Rt of the rotation trajectory 324 can be obtained with high accuracy. For example, the radius Rt of the rotation trajectory 324 is determined such that the sum of squares of the difference between the calculated value of each side of the triangle 73 and the actual value becomes the minimum. Thereafter, the hand center position 220 that overlaps with the barycenter of the triangle 73 is obtained from the coordinates Se10a, Se20a, and Se30a of the three photosensors 72 obtained using the radius Rt of the rotation trajectory 324.

The teaching unit 63 compares the position of the rotation axis J1 obtained as described above with the hand center position 220. When the position of the rotation axis J1 overlaps with the hand center position 220 in plan view, information indicating the current position of the hand 226 is generated as the horizontal teaching information indicating an adequate relationship between the relative positions of the hand 226 and the substrate holder 32 in plan view (i.e., an adequate relationship between the relative positions in the horizontal direction). On the other hand, when the position of the rotation axis J1 and the hand center position 220 fail to overlap in plan view and are shifted from each other, the position in the horizontal direction of the hand 226 is adjusted so as to make the position of the rotation axis J1 overlap with the hand center position 220 in plan view, and information indicating the adjusted position of the hand 226 is generated as the horizontal teaching information (step S14).

The method of calculating the relative positions or the like in step S14 is not limited to the example described above, and may be modified in various ways as long as the horizontal teaching information is generated by calculating the position of the hand 226 relative to the substrate holder 32 in plan view on the basis of the position of the hand 226 relative to the rotation trajectory 324 obtained from the three photosensors 72.

In step S14, the horizontal teaching information may be generated after repeating the calculation of the relative positions of the hand 226 and the substrate holder 32 and the aforementioned positioning of the hand 226. In other words, the calculation of the relative positions of the hand 226 and the substrate holder 32 and the aforementioned positioning of the hand 226 may be repeated before the generation of the horizontal teaching information. Specifically, after the aforementioned horizontal positioning of the hand 226 is completed, the substrate holder 32 may be rotated to again form a rotation trajectory 324, and the position of the hand 226 relative to the substrate holder 32 in plan view is calculated based on the position of the hand 226 relative to the rotation trajectory 324 obtained again from the three photosensors 72. Then, when the hand center position 220 overlaps with the position of the rotation axis J1, information indicating the current position of the hand 226 is generated as the horizontal teaching information. When the hand center position 220 is shifted from the position of the rotation axis J1, the positioning of the hand 226 is performed in order to eliminate this shift. The calculation of the relative positions of the hand 226 and the substrate holder 32 and the positioning of the hand 226 are, for example, repeated a predetermined number of times. Thereafter, information indicating the adjusted position of the hand 226 is generated as the horizontal teaching information. This improves the accuracy of the horizontal teaching information.

When the horizontal teaching information has been generated, the drive controller 62 controls the center robot 22 to move the substrate jig 7 held by the hand 226 illustrated in FIG. 9 downward so that the substrate jig 7 approaches the substrate holder 32 in the up-down direction. At this time, the center 70 of the substrate jig 7 overlaps with the rotation axis J1 of the substrate holder 32 in plan view. Then, when the contact sensor 74 of the substrate jig 7 has detected contact of the substrate holder 32 with the lower surface 71 of the substrate jig 7, only the hand 226 is further moved downward by a predetermined distance and then the movement of the hand 226 is stopped. The teaching unit 63 generates information that indicates the position in the up-down direction of the stopped hand 226 as the vertical teaching information that indicates an adequate relationship between the relative positions of the hand 226 and the substrate holder 32 in the up-down direction (step S15). In other words, the teaching unit 63 generates the vertical teaching information on the basis of the output from the contact sensor 74.

The detection of contact between the substrate jig 7 and the substrate holder 32 in step S15 is specifically implemented by any of the sensor elements 741 of the contact sensor 74, other than the sensor elements 74 that are in contact with the two lugs 228 of the hand 226, detecting the contact with any of the chuck pins 323.

At this time, whether the substrate jig 7 is properly held by the substrate holder 32 may be determined not only by simply detecting the contact with the chuck pins 323 but also by checking whether all of a plurality of sensor elements 741 that correspond respectively to the positions of a plurality of chuck pins 323 have detected contact with the chuck pins 323. As another alternative, whether the substrate jig 7 is properly held by the substrate holder 32 may be determined by using, for example, pressure sensors capable of measuring loads as the sensor elements 741 and checking whether equal loads are measured by the sensor elements 741 that are respectively in contact with the chuck pins 323. In either case, the accuracy of the vertical teaching information is improved.

Figure 13:
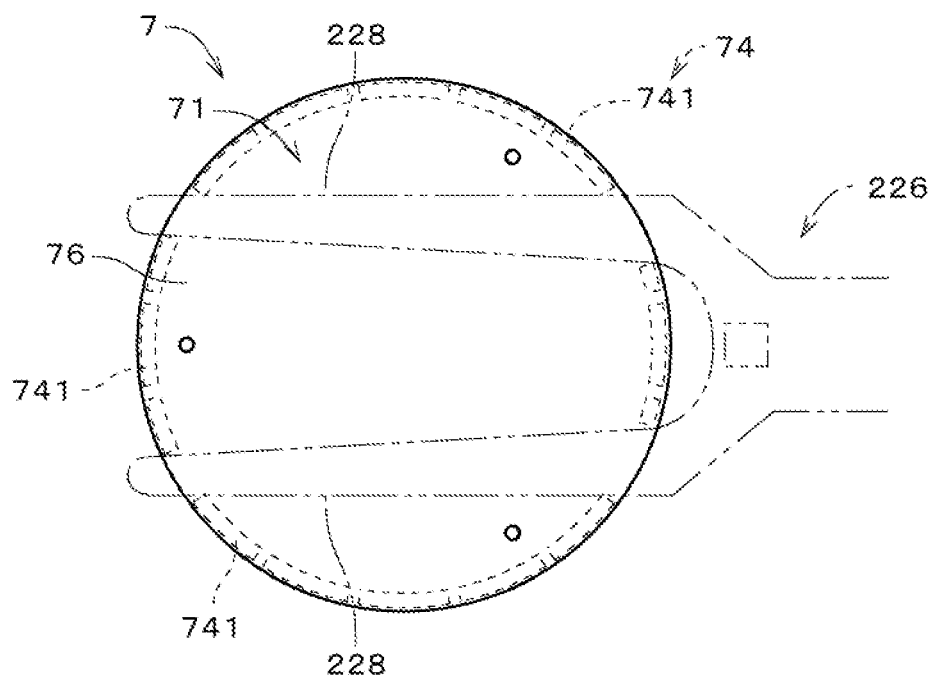
FIG. 13 is a bottom view of another substrate jig.

The sensor elements 741 may be arranged approximately circularly about the center 70 of the substrate jig 7, while avoiding positions of contact with the hand 226, on the outer peripheral portion of the lower surface 71 of the substrate jig 7 (i.e., the lower surface 71 of the jig body 76) as illustrated in FIG. 13. In the example illustrated in FIG. 13, the sensor elements 741 are arranged in the form of four arcs while avoiding positions of contact with the two lugs 228 of the hand 226. To be more specific, the sensor elements 741 are provided approximately all around the circumference, excluding four contacting parts with the lugs 228, on the outer peripheral portion of the lower surface 71 of the jig body 76. When this substrate jig 7 is held by the hand 226, the orientation of the substrate jig 7 is determined so that the sensor elements 741 do not come in contact with the lugs 228. As described above, the contact sensor 74 includes a plurality of sensor elements 741 that are arranged on the outer peripheral portion of the lower surface 71 of the jig body 76 while avoiding the positions of contact with the hand 226. This avoids the possibility of the contact sensor 74 detecting contact with the hand 226 and hence allows the contact sensor 74 to accurately detect contact with the chuck pins 323. As a result, it is possible to improve the accuracy of the vertical teaching information.

In the substrate processing apparatus 1, the carry-in teaching information, the horizontal teaching information, and the vertical teaching information generated by the teaching unit 63 are stored in the storage 61 as the teaching information about the processing unit 21 and the transport arm 221a described above. This teaching information is used to transport a substrate 9 into and out of the processing unit 21 by the hand 226 of the transport arm 221a, and the teaching unit 63 teaches the substrate transport position of the hand 226 to the center robot 22. This prevents the collision of a substrate 9 with the housing 31 and the chuck pins 323 when the substrate 9 is transported into and out of the housing 31. Besides, when the substrate 9 is transferred from the hand 226 to the substrate holder 32, the substrate 9 can be arranged at an adequate position with high accuracy.

In the substrate processing apparatus 1, the transport arm 221a (see FIG. 2) transports the substrate jig 7 to another processing unit 21, and teaching information (i.e., carry-in teaching information, horizontal teaching information, and vertical teaching information) about this other processing unit 21 and the hand 226 of the transport arm 221a is generated using the same procedure as described above (steps S12 to S15). Then, when teaching information about each processing unit 21 of the processing block 20 and the hand 226 of the transport arm 221a has been generated, the substrate jig 7 is moved from the hand 226 of the transport arm 221a to the hand 226 of the transport arm 221b (see FIG. 2) and held by the hand 226 of the transport arm 221b. As described above, the substrate jig 7 has a thickness smaller than the height of the space between the hands 226 of the transport arms 221a and 221b (i.e., a hand space). Therefore, the hand 226 of the transport arm 221b can easily hold the substrate jig 7 without the interference of other constituent elements such as the hand 226 of the transport arm 221a.

Thereafter, teaching information (i.e., carry-in teaching information, horizontal teaching information, and vertical teaching information) about each processing unit 21 and the hand 226 of the transport arm 221b is generated by the same method as the method of generating the teaching information about the hand 226 of the transport arm 221a. The transfer of the substrate jig 7 from the transport arm 221a to the transport arm 221b is implemented via the aforementioned storage shed 700. Specifically, the substrate jig 7 held by the hand 226 of the transport arm 221a is transported into the storage shed 700, and after the transport arm 221a is retracted from the storage shed 700, the hand 226 of the transport arm 221b is transported into the storage shed 700 to hold the substrate jig 7. Even in the case where the center robot 22 includes three or more transport arms, teaching information about each processing unit 21 and the hand 226 of each transport arm is generated in the same manner as described above.

As described above, the substrate processing apparatus 1 includes the processing unit (i.e., the processing unit 21), the transport robot (i.e., the center robot 22), and the teaching unit 63. The processing unit 21 perform predetermined processing on the substrate 9. The center robot 22 transports the substrate 9 to the processing unit 21. The processing unit 21 includes the substrate holder 32 and the substrate rotation mechanism 33. The substrate holder 32 holds a substrate 9 in a horizontal position. The substrate rotation mechanism 33 rotates the substrate holder 32 about the rotation axis J1 pointing in the up-down direction. The center robot 22 includes a hand 226 that transfers a substrate 9 to and from the substrate holder 32.

In the substrate processing apparatus 1, when the substrate jig 7 having the lower surface 71 provided with the three nonlinearly arranged optical sensors (in the above example, the photosensors 72) is held by the hand 226 located above the substrate holder 32, the substrate rotation mechanism 33 rotates the substrate holder 32 to form a circular rotation trajectory 324 of marks (in the above example, the chuck pins 323) provided in advance on the substrate holder 32. The teaching unit 63 calculates the position of the hand 226 relative to the substrate holder 32 in plan view in accordance with the position of the hand 226 relative to the rotation trajectory 324 obtained from the three photosensors 72, and generates the horizontal teaching information indicating an adequate relationship between the relative positions of the hand 226 and the substrate holder 32 in plan view. The teaching unit 63 teaches the substrate transport position of the center robot 22 in a processing unit 21 to the center robot 22.

This simplifies the processing for generating teaching information as compared with the case where a target jig for teaching is provided in the substrate holder 32. As a result, it is possible to obtain highly accurate horizontal teaching information while shortening the time required for the processing of generation. Accordingly, highly accurate movement control of the hand 226 becomes possible when a substrate 9 is transferred from the hand 226 to the substrate holder 32.

As described above, it is preferable that the substrate holder 32 serves as a mechanical chuck that mechanically holds the outer peripheral portion of a substrate 9 by the circularly arranged chuck pins 323, and it is preferable that the above-described marks correspond to one or more of the chuck pins 323. In this way, the constituent elements of the substrate holder 32 that are necessary to hold a substrate 9 are also used as the marks. This enables obtaining highly accurate horizontal teaching information without complicating the structure of the substrate holder 32.

As described above, it is preferable that the above-described rotation trajectory 324 of the marks is formed again by moving the hand 226 in accordance with the relative positions of the hand 226 and the substrate holder 32, calculated by the teaching unit 63, in order to make the center 70 of the substrate jig 7 overlap with the rotation axis J1 in plan view and then causing the substrate rotation mechanism 33 to rotate the substrate holder 32. It is also preferable that, after the horizontal trajectory 324 has been formed again, the teaching unit 63 again calculates the position of the hand 226 relative to the substrate holder 32 in plan view in accordance with the position of the hand 226 relative to the rotation trajectory 324 obtained from the three photosensors 72 to generate the horizontal teaching information. This improves the accuracy of the relationship between the relative positions of the hand 226 and the substrate holder 32 indicated by the horizontal teaching information.

As described above, it is preferable that the center robot 22 further includes another hand 226 located below the above-described hand 226 for transfer of a substrate 9 to and from the substrate holder 32, and it is preferable that the teaching unit 63 generates another horizontal teaching information about this another hand 226, using the same method as the method of generating the horizontal teaching information about the above-described hand 226. Accordingly, it is possible to achieve highly accurate movement control of the hands 226 depending on the characteristics of each hand 26 as compared with the case where, in the center robot 22 including a plurality of hands 226, horizontal teaching information about the uppermost hand 226 is offset in the up-down direction and used as horizontal teaching information about the other hands 226.

As described above, it is preferable that the lower surface 71 of the substrate jig 7 is provided with the contact sensor 74 that detects contact with the substrate holder 32. Then, it is preferable that the center robot 22 moves the hand 226 closer to the substrate holder 32 in the up-down direction, and the teaching unit 63 generates, on the basis of the output from the contact sensor 74, vertical teaching information that indicates an adequate relationship between the relative positions of the hand 226 and the substrate holder 32 in the up-down direction. Accordingly, it is possible to generate the vertical teaching information more easily with a simple configuration. As a result, more accurate movement control of the hand 226 becomes possible when a substrate 9 is transferred from the hand 226 to the substrate holder 32.

As described above, it is further preferable that the substrate holder 32 further includes a plurality of sensor elements 741 serving as a mechanical chuck that mechanically holds the outer peripheral portion of a substrate 9 by the circularly arranged chuck pins 323, and the contact sensor 74 includes a plurality of sensor elements 741 that are circularly arranged on the outer peripheral portion of the lower surface 71. Accordingly, it is possible to accurately detect the condition of the substrate jig 7 being held by the chuck pins 323 and to improve the accuracy of the relationship between the relative positions of the hand 226 and the substrate holder 32, indicated by the vertical teaching information.

As described above, the processing unit 21 further includes the housing 31 that houses the substrate holder 32 and that has the opening 311 through which the substrate 9 are transported in. Preferably, when the hand 226 is inserted in the opening 311 of the housing 31, an image that indicates the relative positions of the hand 226 and the opening 311 is acquired, and the teaching unit 63 generates the carry-in teaching information that indicates an adequate relationship between the relative positions of the hand 226 and the opening 311. Accordingly, it is possible to easily generate the carry-in teaching information. As a result, highly accurate movement control of the hand 226 becomes possible when a substrate 9 is transported into and out of the housing 31.

More preferably, the captured image is the image of the opening 311 obtained by the camera 75 provided on the hand 226 or the substrate jig 7. Thus, it is possible to generate the carry-in teaching information about a plurality of processing units 21 without using a plurality of cameras. That is, it is possible to simplify the configuration required for the generation of the carry-in teaching information.

The teaching information generation method described above is a method for generating teaching information that indicates the substrate transport position of the center robot 22 in the processing unit 21, the method being used in the substrate processing apparatus 1 that includes the processing unit (i.e., the processing unit 21) that performs predetermined processing on the substrate 9 and the transport robot (i.e., the center robot 22) that transports the substrate 9 to and from the processing unit 21. The processing unit 21 includes the substrate holder 32 that holds a substrate 9 in a horizontal position and the substrate rotation mechanism 33 that rotates the substrate holder 32 about the rotation axis J1 pointing in the up-down direction. The center robot 22 includes the hand 226 that transfer the substrate 9 to and from the substrate holder 32.

The teaching information generation method includes the step of holding the substrate jig 7 by the hand 226, the substrate jig 7 having the lower surface 71 provided with the three nonlinearly arranged optical sensors (in the above example, the photosensors 72) (step S11), the step of causing the substrate rotation mechanism 33 to rotate the substrate holder 32 so as to form a circular rotation trajectory 324 of the marks (in the above example, the chuck pins 323) provided in advance on the substrate holder 32 (step S13), and the step of calculating the position of the hand 226 relative to the substrate holder 32 in plan view in accordance with the position of the hand 226 relative to the rotation trajectory 324 obtained from the three photosensors 72 of the substrate jig 7 located above the substrate holder 32 and generating horizontal teaching information that indicates an adequate relationship between the relative positions of the hand 226 and the substrate holder 32 in plan view (step S14). This simplifies the processing for generating teaching information as described above. As a result, it is possible to obtain highly accurate horizontal teaching information while shortening the time required for the processing of generation.

The substrate jig 7 described above does not necessarily have to be prepared in the substrate processing apparatus 1 from the startup of the substrate processing apparatus 1. For example, the substrate jig 7 that includes the generally disk-shaped jig body 76 and the three optical sensors 72 arranged nonlinearly on the lower surface 71 of the jig body 76 may be introduced into the substrate processing apparatus 1 already used (i.e., may be retrofitted) and may be used to generate the teaching information. Even in this case, the processing for generating teaching information can be simplified in the same manner as described above. As a result, it is possible to obtain highly accurate horizontal teaching information while shortening the time required for the processing of generation.

The program 89 described above (i.e., the program for generating teaching information) does not necessarily have to be stored in the computer 8 from the startup of the substrate processing apparatus 1. For example, a teaching set that includes the storage medium 80 and the substrate jig 7 may be introduced into the substrate processing apparatus 1 already used (i.e., may be retrofitted), the storage medium 80 storing the program 89 for generating horizontal teaching information that indicates an adequate relationship between the relative positions of the hand 226 and the substrate holder 32 in plan view, and the substrate jig 7 having the lower surface 71 provided with the three nonlinearly arranged optical sensors (in the above example, the photosensors 72). In this case, as a result of the program 89 being executed by the computer 8, the position of the hand 226 relative to the substrate holder 32 in plan view is calculated in accordance with the position of the hand 226 relative to the aforementioned rotation trajectory 324 obtained from the three photosensors 72, so as to generate the horizontal teaching information. This simplifies the processing for generating teaching information in the same manner as described above. As a result, it is possible to obtain highly accurate horizontal teaching information while shortening the time required for the processing of generation.

Figure 14:
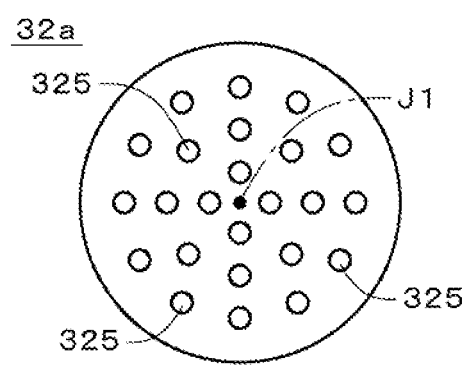
FIG. 14 is a plan view of another substrate holder.

In the substrate processing apparatus 1, the substrate holder 32 of the processing unit 21 does not necessarily have to be a mechanical chuck. Also, the marks used to generate the horizontal teaching information do not necessarily have to be the chuck pins 323. For example, as illustrated in FIG. 14, a vacuum chuck having an upper surface provided with a plurality of suction ports 325 that absorb and hold a substrate 9 may be provided as a substrate holder 32a in the processing unit 21 (see FIG. 4). In this case, one or more of the suction ports 325 may be used as the marks described above. Accordingly, it is possible, in the same manner as described above, to obtain highly accurate horizontal teaching information without complicating the structure of the substrate holder 32a. For example, the marks used to generate the horizontal teaching information may correspond to one of the suction ports 325 that is located on the outermost side in the radial direction about the rotation axis J1, or two or more of the suction ports 325 that are arranged on the circumference of the same circle located on the outermost side in the radial direction.

Figure 15:
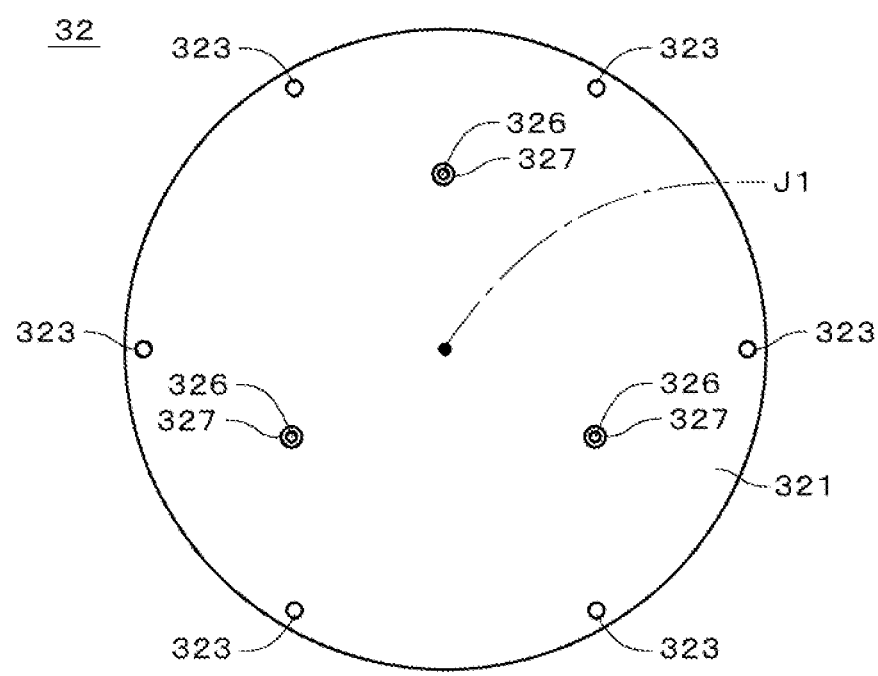
FIG. 15 is a plan view of another substrate holder.

In the substrate processing apparatus 1, as illustrated in FIG. 15, the substrate holder 32 may be provided with a plurality of support pins 326 that transfer the substrate 9 to and from the hand 226. In the example illustrated in FIG. 15, three support pins 326 are arranged on the circumference of the same circle about the rotation axis J1. The support pins 326 are inserted in holes 327 formed in the base 321 of the substrate holder 32 and are capable of projecting upward from the upper surface of the base 321. The support pins 326 receive a substrate 9 from a hand 226 above the chuck pins 323 and move downward to transfer the substrate 9 to the chuck pins 323. The support pins 326 also receive a substrate 9 from the chuck pins 323 and move upward to transfer the substrate 9 to the hand 226 above the chuck pins 323.

The support pins 326 may or may not rotate together with the base 321 or the chuck pins 323. When the support pins 326 rotate, one or more of the support pins 326 may be used as the marks described above. When the support pins 326 do not rotate, one or more of the holes 327 in the base 321, into which the support pins 326 are inserted, may be used as the marks described above. In either case, it is possible to obtain highly accurate horizontal teaching information without complicating the structure of the substrate holder 32 in the same manner as described above. Note that when the substrate holder 32 is provided with a plurality of support pins 326, contact sensors 74 are provided at positions corresponding to the support pins 326 on the lower surface 71 of the substrate jig 7.

In the substrate processing apparatus 1, the marks used to generate the horizontal teaching information do not necessarily have to be provided on the substrate holder 32. For example, in the case where the processing unit 21 also includes a constituent element that rotates about the rotation axis J1 (hereinafter, also referred to as the "rotary part") other than the substrate holder 32, the marks described above may be provided on this rotary part other than the substrate holder 32. As another alternative, the photosensors 72 provided on the substrate jig 7 may be arranged at positions other than the positions on the lower surface 71 of the substrate jig 7, in accordance with the relationship between the positions of the rotary part and the substrate jig 7. The shape of the substrate jig 7 in plan view does not necessarily have to be the same as the shape of substrates 9.

Even in this case, the substrate processing apparatus 1 includes the processing unit (i.e., the processing unit 21), the transport robot (i.e., the center robot 22), and the teaching unit 63. The processing unit 21 performs predetermined processing on the substrate 9. The center robot 22 transports the substrate 9 to the processing unit 21. The teaching unit 63 teaches the substrate transport position of the center robot 22 in the processing unit 21 to the center robot 22. The processing unit 21 includes the substrate holder 32 and the substrate rotation mechanism 33. The substrate holder 32 holds a substrate 9 in a horizontal position. The substrate rotation mechanism 33 rotates the substrate holder 32 about the rotation axis J1 pointing in the up-down direction. The center robot 22 includes the hand 226 used to transfer substrate 9 to and from the substrate holder 32. In the processing unit 21, the rotary part other than the substrate holder 32 is also rotated about the rotation axis J1.

In the substrate processing apparatus 1, when a hand 226 located above the substrate holder 32 holds the substrate jig 7 provided with the three nonlinearly arranged photosensors 72, the rotary part described above is rotated to form a circular rotation trajectory 324 of marks provided in advance on the rotary part. The teaching unit 63 calculates the position of the hand 226 relative to the rotation axis J1 in plan view in accordance with the position of the hand 226 relative to the rotation trajectory 324 obtained from the three photosensors 72 and generates horizontal teaching information that indicates an appropriate relationship between the relative positions of the hand 226 and the substrate holder 32 in plan view.

This simplifies the processing for generating teaching information as described above. As a result, it is possible to obtain highly accurate horizontal teaching information while shortening the time required for the processing of generation. For example, the above-described rotary part may be the cup part 34 configured to be rotatable about the rotation axis J1. In this case, the marks described above may, for example, be constituent elements that are provided on the upper edge of the rotatable cup part 34, or the upper edge as a whole may serve as the marks described above.

The substrate processing apparatus 1, the teaching information generation method, and the teaching set described above may be modified in various ways.

For example, the camera 75 used in the generation of the carry-in teaching information does not necessarily have to be provided on the hand 226 or the substrate jig 7, and may be fixed at an appropriate position on the processing block 20. In this case, two or more cameras 75 may be provided as necessary in order to capture images of the openings 311 of a plurality of processing units 21.

The substrate jig 7 may have any shape other than a generally circular shape in plan view. The substrate jig 7 may have a thickness greater than the height of the hand space. In this case, if the substrate jig 7 cannot be held by the hand 226 of the lower transport arm 221b, teaching information (i.e., carry-in teaching information, horizontal teaching information, and vertical teaching information) acquired for the hand 226 of the upper transport arm 221a may be offset in the up-down direction and used as teaching information about the hand 226 of the lower transport arm 221b.

As described above, the substrate jig 7 may be provided with other optical sensors such as cameras that include a CMOS or CCD sensor, instead of the photosensors 72. Even in this case, the processing for generating teaching information can be simplified by using the substrate jig 7 in the same manner as described above 7. In the case where cameras including a CMOS sensor are used as the optical sensors described above, the detection of the marks such as the chuck pins 323 may be implemented by, for example, pattern matching between the images acquired by these cameras and a reference image for the chuck pins 323. Note that it is possible, by using the photosensors 72 as the optical sensors described above, not only to simplify the structure of the substrate jig 7 but also to simplify processing of information from the optical sensors during generation of the teaching information.

In the substrate jig 7, the contact sensor 74 used to generate vertical teaching information does not necessarily have to include a plurality of sensor elements 741. For example, one contact sensor 74 may be provided at a position avoiding a position of contact with the lugs 228 of a hand 226 on the outer peripheral portion of the lower surface 71 of the substrate jig 7, and this contact sensor 74 may be used to detect contact between the substrate jig 7 and one chuck pin 323. In this case as well, the contact sensor 74 will not detect contact with the hand 226, and therefore it is possible to detect contact between the contact sensor 74 and the chuck pin 323 with high accuracy. As a result, the accuracy of the vertical teaching information is improved.

The teaching information generated by the teaching unit 63 does not necessarily have to include the carry-in teaching information and/or the vertical teaching information, as long as it includes at least the horizontal teaching information. That is, the carry-in teaching information may be generated by a method different from the above-described method of generation by the teaching unit 63 using the camera 75. The vertical teaching information may also be generated by a method different from the above-described method of generation by the teaching unit 63 using the substrate jig 7. In this case, the contact sensor 74 may be omitted from the substrate jig 7.

The teaching set described above may include a plurality of substrate jigs 7.

In the substrate processing apparatus 1, the structure of the center robot 22 may be modified in various ways. The shape and structure of the hands 226 of the center robot 22 may also be modified in various ways. For example, the hands 226 may have a generally circular shape in plan view that comes in contact with all around the outer peripheral edges of a substrate 9 and the substrate jig 7. Note that the structure of the indexer robot 12 may also be modified in various ways.

The processing block 20 of the substrate processing apparatus 1 may include processing units having various structures other than the processing units 21. These processing units may perform a variety of processing on substrates 9.

The substrate processing apparatus 1 described above may be used to process glass substrates other than semiconductor substrates, such as glass substrates for use in flat panel displays including liquid crystal displays and organic electroluminescence (EL) displays, or glass substrates for use in other display devices. The substrate processing apparatus 1 described above may also be used to process substrates such as optical disk substrates, magnetic disk substrates, magneto-optical disk substrates, photomask substrate, ceramic substrates, and solar cell substrates.

The configurations of the preferred embodiments and variations described above may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

REFERENCE SIGNS LIST

1 Substrate processing apparatus
7 Substrate jig

8 Computer
9 Substrate
21 Processing unit
22 Center robot
31 Housing
32, 32a Substrate holder
33 Substrate rotation mechanism
34 Cup part
63 Teaching unit
70 Center (of substrate jig)
71 Lower surface (of substrate jig)
72 Photosensor
74 Contact sensor
75 Camera
80 Storage medium
89 Program
226 Hand
311 Opening
323 Chuck pin
324 Rotation trajectory
325 Suction port
741 Sensor element
J1 Rotation axis
S11 to S15 Step

The invention claimed is:

1. A substrate processing apparatus comprising:
a processing unit that performs predetermined processing on a substrate;
a transport robot that transports said substrate to said processing unit; and
a teaching unit that teaches a substrate transport position of said transport robot in said processing unit to said transport robot,
wherein said processing unit includes:
a substrate holder that holds said substrate in a horizontal positon; and
a substrate rotation mechanism that rotates said substrate holder about a rotation axis pointing in an up-down direction,
said transport robot includes a hand that transfers said substrate to and from said substrate holder,
when said hand located above said substrate holder holds a substrate jig having a lower surface provided with three optical sensors that are arranged nonlinearly, said substrate rotation mechanism rotates said substrate holder to form a circular rotation trajectory of a mark provided in advance on said substrate holder, and
said teaching unit calculates a position of said hand relative to said substrate holder in plan view in accordance with the position of said hand relative to said rotation trajectory obtained from each of said three optical sensors and generates horizontal teaching information that indicates an adequate relationship between relative positions of said hand and said substrate holder in plan view.

2. The substrate processing apparatus according to claim 1, wherein
said substrate holder is a mechanical chuck that mechanically holds an outer peripheral portion of said substrate by a plurality of chuck pins that are arranged circularly, and
said mark corresponds to one or more of said plurality of chuck pins.

3. The substrate processing apparatus according to claim 1, wherein
said substrate holder is a vacuum chuck having an upper surface provided with a plurality of suction ports to absorb and hold said substrate, and
said mark corresponds to one or more of said plurality of suction ports.

4. The substrate processing apparatus according to claim 1, wherein
said hand is moved to make said rotation axis and a center of said substrate jig overlap each other in plan view in accordance with relative positions of said hand and said substrate holder in plan view calculated by said teaching unit,
said substrate rotation mechanism rotates said substrate holder to again form said rotation trajectory of said mark, and
after the formation of said rotation trajectory, said teaching unit again calculates a position of said hand relative to said substrate holder in plan view in accordance with the position of said hand relative to said rotation trajectory obtained from each of said three optical sensors and generates said horizontal teaching information.

5. The substrate processing apparatus according to claim 1, wherein
said transport robot further includes a different hand that is located below said hand and that transfers said substrate to and from said substrate holder, and
said teaching unit generates different horizontal teaching information about said different hand in the same manner as said horizontal teaching information about said hand.

6. The substrate processing apparatus according to claim 1, wherein
said lower surface of said substrate jig is provided with a contact sensor that detects contact with said substrate holder,
said transport robot moves said hand closer to said substrate holder in the up-down direction, and
said teaching unit generates vertical teaching information that indicates an adequate relationship between relative positions of said hand and said substrate holder in the up-down direction in accordance with an output from said contact sensor.

7. The substrate processing apparatus according to claim 6, wherein
said substrate holder is a mechanical chuck that mechanically holds an outer peripheral portion of said substrate by a plurality of chuck pins that are arranged circularly, and
said contact sensor includes a plurality of sensor elements that are arranged circularly on an outer peripheral portion of said lower surface of said substrate jig.

8. The substrate processing apparatus according to claim 1, wherein
said processing unit further includes a housing that houses said substrate holder and that has an opening through which said substrate is transported in,
when said hand is inserted in said opening of said housing, an image that indicates relative positions of said hand and said opening is captured, and
said teaching unit generates, in accordance with said captured image, carry-in teaching information that indicates an adequate relationship between the relative positions of said hand and said opening.

9. The substrate processing apparatus according to claim 8, wherein said image is an image of said opening captured by a camera provided on said hand or said substrate jig.

10. A substrate processing apparatus comprising:
a processing unit that performs predetermined processing on a substrate;
a transport robot that transports said substrate to said processing unit; and
a teaching unit that teaches a substrate transport position of said transport robot in said processing unit to said transport robot,
wherein said processing unit includes:
a substrate holder that holds said substrate in a horizontal position; and
a substrate rotation mechanism that rotates said substrate holder about a rotation axis pointing in an up-down direction,
said transport robot includes a hand that transfers said substrate to and from said substrate holder,
said processing unit also rotates a rotary part other than said substrate holder about said rotation axis,
when said hand located above said substrate holder holds a substrate jig provided with three optical sensors that are arranged nonlinearly, said rotary part is rotated to form a circular rotation trajectory of a mark provided in advance on said rotary part, and
said teaching unit calculates a positon of said hand relative to said rotation axis in plan view in accordance with the position of said hand relative to said rotation trajectory obtained from each of said three optical sensors and generates horizontal teaching information that indicates an adequate relationship between relative positions of said hand and said substrate holder in plan view.

11. A teaching information generation method of generating teaching information and for use in a substrate processing apparatus, the substrate processing apparatus including a processing unit that performs predetermined processing on a substrate and a transport robot that transports said substrate to said processing unit, the teaching information teaching a substrate transport position of said transport robot in said processing unit,
said processing unit including:
a substrate holder that holds said substrate in a horizontal position; and
a substrate rotation mechanism that rotates said substrate holder about a rotation axis pointing in an up-down direction,
said transport robot including a hand that transfers said substrate to and from said substrate holder,
said teaching information generation method comprising:
a) holding a substrate jig by said hand, the substrate jig having a lower surface provided with three optical sensors that are arranged nonlinearly;
b) causing said substrate rotation mechanism to rotate said substrate holder to form a circular rotation trajectory of a mark provided in advance on said substrate; and
c) calculating a position of said hand relative to said substrate holder in plan view in accordance with the position of said hand relative to said rotation trajectory obtained from each of said three optical sensors of said substrate jig located above said substrate holder and generating horizontal teaching information that indicates an adequate relationship between relative positions of said hand and said substrate holder in plan view.

12. A teaching set for use in a substrate processing apparatus, the substrate processing apparatus including a processing unit that performs predetermined processing on a substrate and a transport robot that transports said substrate to said processing unit, the teaching set being used to teach a substrate transport position of said transport robot in said processing unit to said transport robot,
said processing unit including:
a substrate holder that holds said substrate in a horizontal position;
a substrate rotation mechanism that rotates said substrate holder about a rotation axis pointing in an up-down direction; and
said transport robot including a hand that transfers said substrate to and from said substrate holder,
said teaching set comprising;
a substrate jig having a lower surface provided with three optical sensors that are arranged nonlinearly; and
a storage medium that stores a program for generating horizontal teaching information that indicates an adequate relationship between relative positions of said hand and said substrate holder in plan view,
when said hand located above said substrate holder holds said substrate jig, said substrate rotation mechanism rotates said substrate holder to form a circular rotation trajectory of a mark provided in advance on said substrate holder, and
said program is executed by a computer to calculate a position of said hand relative to said substrate holder in plan view in accordance with the position of said hand relative to said rotation trajectory obtained from each of said three optical sensors and to generate said horizontal teaching information.

13. A substrate jig for use in a substrate processing apparatus to generate teaching information, the substrate processing apparatus including a processing unit that performs predetermined processing on a substrate and a transport robot that transports said substrate to said processing unit, the teaching information teaching a substrate transport position of said transport robot in said processing unit, the substrate jig comprising:
a generally disk-shaped jig body; and
three optical sensors arranged nonlinearly on a lower surface of said jig body,
wherein said processing unit includes:
a substrate holder that holds said substrate in a horizontal position; and
a substrate rotation mechanism that rotates said substrate holder about a rotation axis pointing in an up-down direction,
said transport robot includes a hand that transfers said substrate to and from said substrate holder, and
the generation of said teaching information includes:
a) causing said hand to hold said substrate jig;
b) causing said substrate rotation mechanism to rotate said substrate holder to form a circular rotation trajectory of a mark provided in advance on said substrate holder; and
c) calculating a position of said hand relative to said substrate holder in plan view in accordance with the position of said hand relative to said rotation trajectory obtained from each of said three optical sensors of said substrate jig that is located above said substrate holder and generating horizontal teaching information that indicates an adequate relationship between relative positions of said hand and said substrate holder in plan view.

14. The substrate jig according to claim 13, further comprising:

a contact sensor that is provided on said lower surface of said jig body and that detects contact with said substrate holder, wherein said substrate holder is a mechanical chuck that mechanically holds an outer peripheral portion of said substrate jig by a plurality of chuck pins that are arranged circularly, the generation of said teaching information further includes:

d) after said operation c), moving said hand closer to said substrate holder in an up-down direction to generate vertical teaching information that indicates an adequate relationship between relative positions of said hand and said substrate holder in the up-down direction in accordance with an output from said contact sensor, and said contact sensor is arranged at a position other than where said contact sensor comes in contact with said hand, on an outer peripheral portion of said lower surface of said substrate jig.

* * * * *